United States Patent [19]

Montegari

[11] Patent Number: 4,494,017
[45] Date of Patent: Jan. 15, 1985

[54] COMPLEMENTARY DECODE CIRCUIT

[75] Inventor: Frank A. Montegari, Wappingers Falls, N.Y.

[73] Assignee: International Business Machines Corporation, Armonk, N.Y.

[21] Appl. No.: 363,166

[22] Filed: Mar. 29, 1982

[51] Int. Cl.$^3$ .................. H03K 19/086; H03K 19/20; H03K 19/013

[52] U.S. Cl. .................................... 307/463; 307/455; 307/456

[58] Field of Search ............... 307/455, 456, 463, 467; 365/230

[56] References Cited

U.S. PATENT DOCUMENTS

| | | | |
|---|---|---|---|
| 2,964,652 | 12/1960 | Yourke | 307/88.5 |
| 2,994,852 | 8/1961 | Schmookler | 307/463 |
| 3,040,192 | 6/1962 | Slobodzinski | 307/88.5 |
| 3,259,761 | 7/1966 | Narud et al. | 307/88.5 |
| 3,914,620 | 10/1975 | Millhollan et al. | 307/215 |
| 3,916,215 | 10/1975 | Gaskill, Jr. et al. | 307/203 |
| 4,039,867 | 8/1977 | Blumberg et al. | 307/455 |
| 4,195,358 | 3/1980 | Yuen | 365/230 |
| 4,207,556 | 6/1980 | Sugiyama et al. | 307/467 X |
| 4,287,435 | 9/1981 | Cavaliere et al. | 307/455 X |
| 4,355,245 | 10/1982 | Isogai | 307/455 |

OTHER PUBLICATIONS

IBM TDB "Circuit for Generating Complementary Control Signals" by A. Brunin, vol. 21, No. 1, Jun. 1978, pp. 211-212.
IBM TDB "Self-Biased, Low Voltage, Emitter-Followerless Current Switch" by R. J. Blumberg et al., vol. 16, No. 3, Aug. 1973, p. 1017.
IBM TDB "Control Signal Generator" by A. Brunin, vol. 21, No. 1, Jun. 1978, pp. 209-210.

Primary Examiner—Larry N. Anagnos
Attorney, Agent, or Firm—Wesley DeBruin

[57] ABSTRACT

The decode circuit utilizes NPN and PNP transistors and performs a complete decode function in only one logic level with the no need for a true/complement input of each binary input. A first embodiment of the decoder provides an UP level output when selected. A second embodiment of the decoder provides a DOWN level output when selected. The decode circuit may be used as an address decode circuit in a memory and also portion(s) of the decode circuit may be used independently as a binary logic circuit. Also disclosed is a complementary current switch logic circuit with dual phase outputs.

19 Claims, 26 Drawing Figures

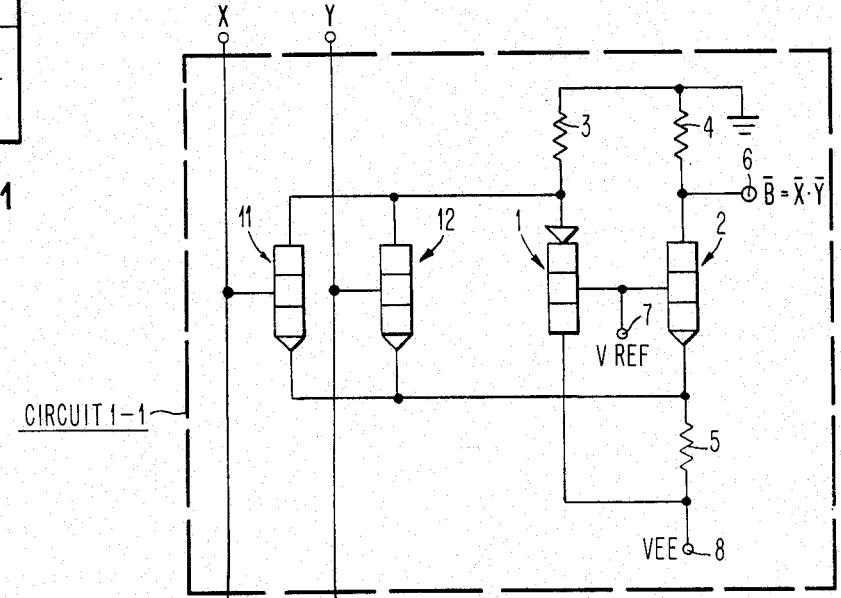
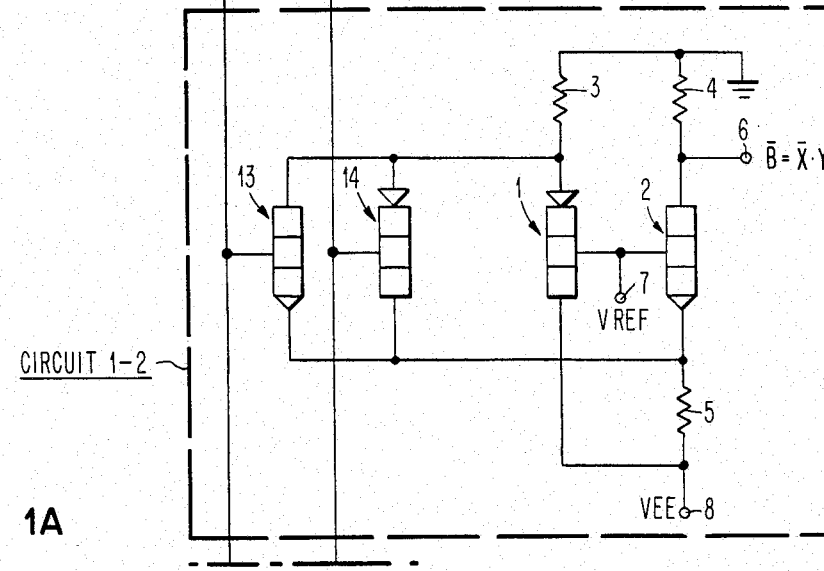
FIG. 1
FIG. 1A

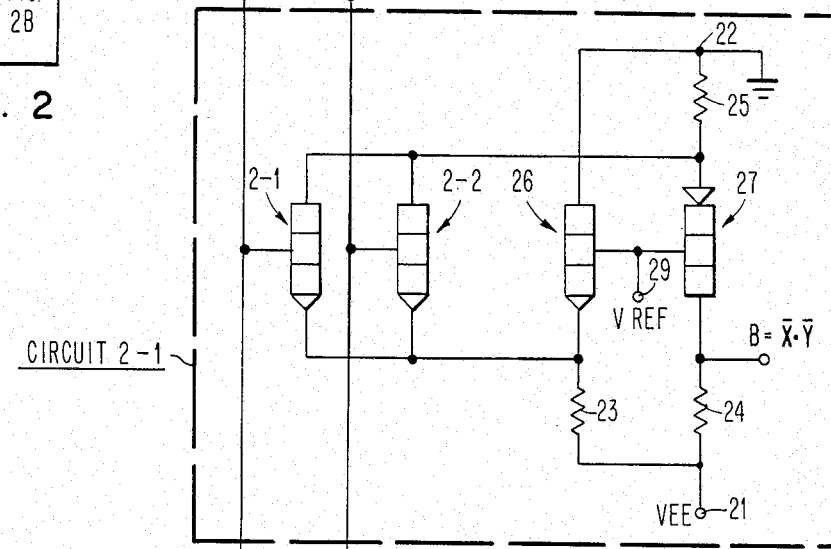
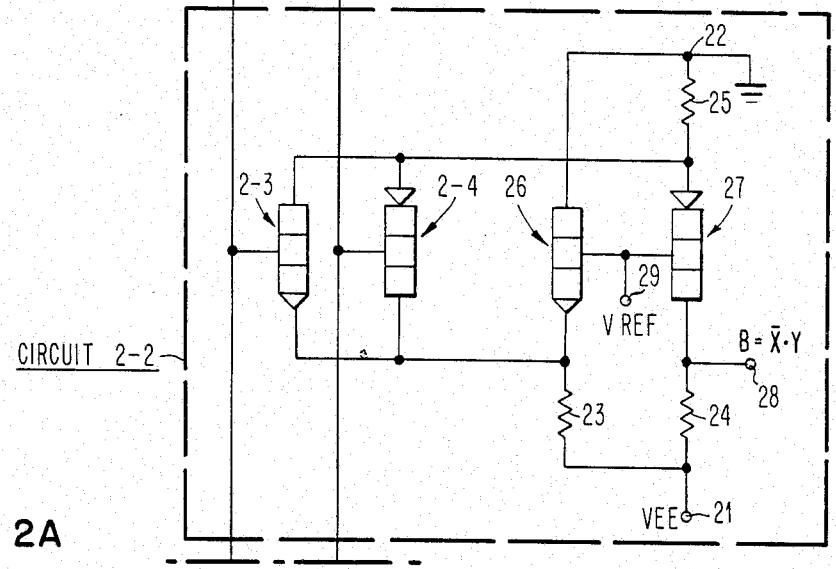
FIG. 2
FIG. 2A

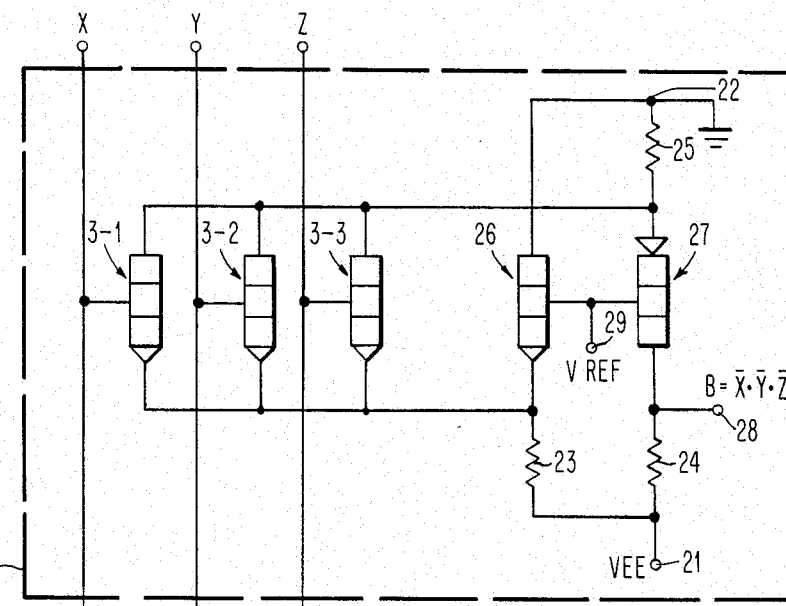
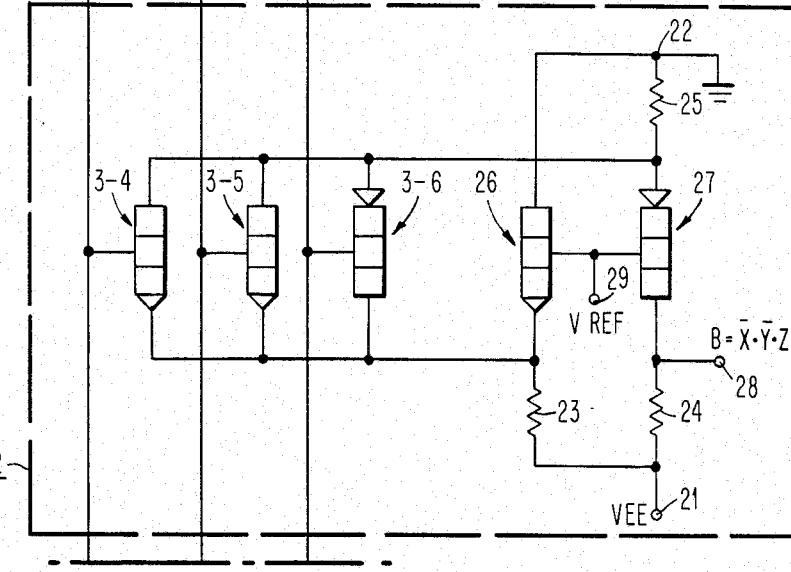
FIG. 3
FIG. 3A

COMPLEMENTARY DECODE CIRCUIT

BACKGROUND OF THE INVENTION

The invention relates to logical binary circuitry and circuitry having particular utility as a decode circuit for use in solid-state matrix memory arrays such as a PROM, ROM or RAM.

Solid-state matrix memory arrays in which information is stored are well known in the art. The matrix array, as a single integrated circuit comprises rows and columns of parallel electrical conductors formed with memory cells (or memory elements) connecting the intersections or cross-over points of the rows and columns. The RAM will have a memory cell at each cross-over point, whereas the ROM will have a memory element at, at least certain cross-over points. The complementary address decode circuitry, in accordance with the invention finds particular utility when employed in the circuitry utilized to address a matrix memory array.

It will be readily appreciated by persons skilled in the art, by virtue of the detailed description setforth hereinafter, that the circuitry of the invention may be employed in applications other than matrix memories. It will further be apparent, from the detailed description hereinafter, that a portion or all of the complementary address decode circuit in accordance with the invention may be employed as a binary logic circuit for accepting a plurality of binary inputs and providing one or more logical binary outputs which are respectively logical binary functions of said inputs.

BACKGROUND ART

Numerous Decode circuits and binary logical circuits are known to the art. The following patents and publications are not necessarily fully representative of the art. It is to be appreciated, with reference to the subject invention, that the following art is not submitted to be the only prior art, the best prior art, or the most pertinent prior art.

Accordingly, it is an object of this invention to provide an improved decode circuit and logic circuit.

Reference is made to U.S. Pat. No. 2,964,652 entitled "Transistor Switching Circuits" granted Dec. 13, 1960 to H. S. Yourke.

Reference is made to U.S. Pat. No. 3,040,192 entitled "Logic, Exclusive-OR, and Shift Register Circuits Utilizing Directly Connected Cascade Transistors in "Tree" Configuration" granted Jun. 19, 1962 to E. J. Slobodzinski.

Reference is made to U.S. Pat. No. 3,259,761 entitled "Integrated Circuit Logic" granted Jul. 5, 1966 to J. A. Narud et al.

Reference is made to U.S. Pat. No. 3,337,748 entitled "Low Oissipation Inductance Drivers" granted Aug. 22, 1967 to W. T. Rusch et al.

Reference is made to U.S. Pat. No. 3,610,949 entitled "Circuit For Performing Logic Functions" granted Oct. 5, 1971 to D. Armgarth.

Reference is made to U.S. Pat. No. 3,816,758 entitled "Digital Logic Circuit" granted Jun. 11, 1974 to H. H. Berger et al.

Reference is made to U.S. Pat. No. 3,863,230 entitled "MOS Memory Decoder Circuit" granted Jan. 28, 1975 to W. M. Regitz.

Reference is made to U.S. Pat. No. 3,911,428 entitled "Decode Circuit" granted Oct. 7, 1975 to W. B. Chin.

Reference is made to U.S. Pat. No. 3,914,620 entitled "Decode Circuitry For Bipolar Random Access Memory" granted Oct. 21, 1975 to M. S. Millhollan et al.

Reference is made to U.S. Pat. No. 3,916, 215 entitled "Programmable ECL Threshold Logic Gate" granted Oct. 28, 1975 to J. R. Gaskill et al.

Reference is made to U.S. Pat. No. 3,916,218 entitled "Integrated Power Supply For Merged Transistor Logic Circuit" granted Oct. 28, 1975 to H. H. Berger et al.

Reference is made to U.S. Pat. No. 3,956,641 entitled "Complementary Transistor Circuit For Carrying Out Boolean Functions" granted May 11, 1976 to H. H. Berger et al.

Reference is made to U.S. Pat. No. 4,195,358 entitled "Decoder For A PROM" granted Mar. 25, 1980 to R. C. Yuen.

Reference is made to U.S. Pat. No. 4,200,917 entitled "Quiet Column Decoder" granted Apr. 29, 1980 to J. D. Moench.

Reference is made to the following IBM Technical Disclosure Bulletin Publications:
1. "Self-Biased, Low Voltage, Emitter Followerless Current Switch" by R. J. Blumberg et al., Vol. 16, No. 3, Aug. 1973, page 1017;
2. "Control Signal Generator" by A. Brunin, Vol. 21, No. 1, Jun. 1978, pages 209210;
3. "Self-Gating, High-Speed Metal-Oxide Semiconductor Decoder" by R. S. Hockedy, Vol. 16, No. 6, Nov. 1973, pages 1922–1923; and
4. "Circuit For Generating Complementary Control Signals" by A. Brunin, Vol. 21, No. 1, Jun. 1978, pages 211–212.

SUMMARY OF THE INVENTION

The complementary address decode circuit performs a complete decode function in only one logic level. One embodiment of the invention is a decoder which produces an UP level output when selected. A second embodiment of the invention is a decoder which produces a DOWN level output when selected. The need for a True/Complement Generator preceding the decode circuit is eliminated through the use of complementary transistors in the decode array. NPN and PNP transistors are employed to produce the desired address outputs. The practice of the invention eliminates the need for high current drivers usually required to drive the high (metallurgy) capacitance of the decode wire matrix since the matrix is now capable of being driven directly by low impedance off chip nets (not shown). The address decode circuit outputs may be buffered by emitter followers and used to select a row and column of an array.

Features and advantages of the complementary address decode circuit and logic circuit, in accordance with the invention, which will be more apparent from the detailed description hereinafter, are:
1. Complete decoding accomplished in only one logic level.
2. Simplified design improves performance.
3. True/Complement generator not required.
4. High Current Decode Drivers not required.
5. Decode driven directly from off chip nets.
6. Saves silicon area usually occupied by True-Complement Generators.

7. Decoder can be configured for UP or DOWN select.
8. Uses isolated vertical PNP transistors.

The invention will be summarized for a decoder, in accordance with the invention, having first and second inputs and selecting one of four outputs. First and second NPN transistors together with an emitter current source provide a NPN current switch. The collector of the non-inverting NPN transistor is connected to ground. First and second PNP transistors together with a collector load resistor and an emitter current source provide a PNP current switch. The collector of the input NPN transistor is connected to the emitters of the PNP transistors. The collector of the input PNP transistor is connected to the emitters of the PNP transistors. Thus, a dual current switch capable of being turned on or off by either the NPN or PNP input transistors is formed.

Also disclosed is a logic circuit having n inputs for accepting n binary inputs, where n is a positive integer, said logic circuit having a first output terminal for providing as an output a predetermined logical binary function of said n binary inputs and a second output terminal for providing as an output the complement of said predetermined logical binary function of said n binary inputs, said logic circuit comprising: n input transistors, each of said n input transistors having an emitter, base and collector, where n is integer number having minimal value of 2, and a range 2, 3, 4, 5, 6 . . . through 16, p of said n transistors being of a first conductivity type, k of said n transistors being of a second conductivity type, where p and k are respectively integers having a value within the range 0, 1, 2, 3, 4 . . . through n, and p+k=n; an n+1 transistor of said first conductivity type, said n+1 transistor having an emitter, base and collector; an n+2 transistor of said first conductivity type, said n+2 transistor having an emitter, base and collector, said base of said n+2 transistor being connected to said collector of said n+1 transistor; an n+3 transistor of said second conductivity type, said n+3 transistor having an emitter, base and collector; an n+4 transistor of said second conductivity type, said n+4 transistor having an emitter, base and collector, said base of said n+4 transistor being connected to said collector of said n+3 transistor; first passive connection means connecting in common said collectors of said p transistors of said first conductivity type, said emitters of said k transistors of said second conductivity type and said emitter of said n+3 transistor; second passive connection means connecting in common said emitters of said p transistors of said first conductivity type, said collectors of said k transistors of said second conductivity type and said emitter of said n+1 transistor; third passive connection means for respectively connecting each of said n inputs of said logic circuit to the base of a discrete one of said n input transistors; fourth passive connection means for connecting said first output terminal of said logic circuit to said emitter of said n+2 transistor; fifth passive connection means for connecting said second output terminal of said logic circuit to said emitter of said n+4 transistor; sixth passive connection means for connecting said base of said n+1 transistor and said base of said n+3 transistor to a source of reference potential; a first resistor connected between said collector of said n+1 transistor and a first source of potential; a second resistor connected between said emitter of said n+1 transistor and a second source of potential; a third resistor connected between said emitter of said n+3 transistor and said first source of potential; a fourth resistor connected between said collector of said n+3 transistor and said second source of potential; a fifth resistor connected between said emitter of said n+4 transistor and said first source of potential; a sixth resistor connected between said emitter of said n+2 transistor and said second source of potential; and additional passive connection means for connecting said collector of said n+2 transistor to said first source of potential and also connecting said collector of said n+4 transistor to said second source of potential.

These and other features and advantages of my invention will be apparent from the following more particular description of the preferred embodiment of the invention as illustrated in the accompanying drawings.

BRIEF DESCRIPTION OF THE DRAWINGS

FIGS 1A and 1B placed together as shown in FIG. 1 disclose a two binary input decode circuit, in accordance with the invention, wherein the selected output (one out of four) is at a DOWN level. Shown in FIG. 1 are four similar logic circuits respectively bearing the legends "Circuit 1-1", "Circuit 1-2", "Circuit 1-3" and "Circuit 1-4".

FIGS. 2A and 2B placed together as shown in FIG. 2 disclose a two binary input decode circuit, in accordance with the invention, wherein the selected output (one out of four) is at an UP level. Shown in FIG. 2 are four similar logic circuits respectively bearing the legends "Circuit 2-1", "Circuit 2-2", "Circuit 2-3" and "Circuit 2-4".

FIGS. 3A, 3B, 3C and 3D placed together as shown in FIG. 3 disclose a three binary input decode circuit, in accordance with the invention, wherein the selected output (one out of eight) is an UP level. Shown in FIG. 3 are eight similar logic circuits respectively bearing the legends "Circuit 3-1", "Circuit 3-2". . . "Circuit 3-7" and "Circuit 3-8".

DESCRIPTION OF THE PREFERRED EMBODIMENTS

Figure 1B:
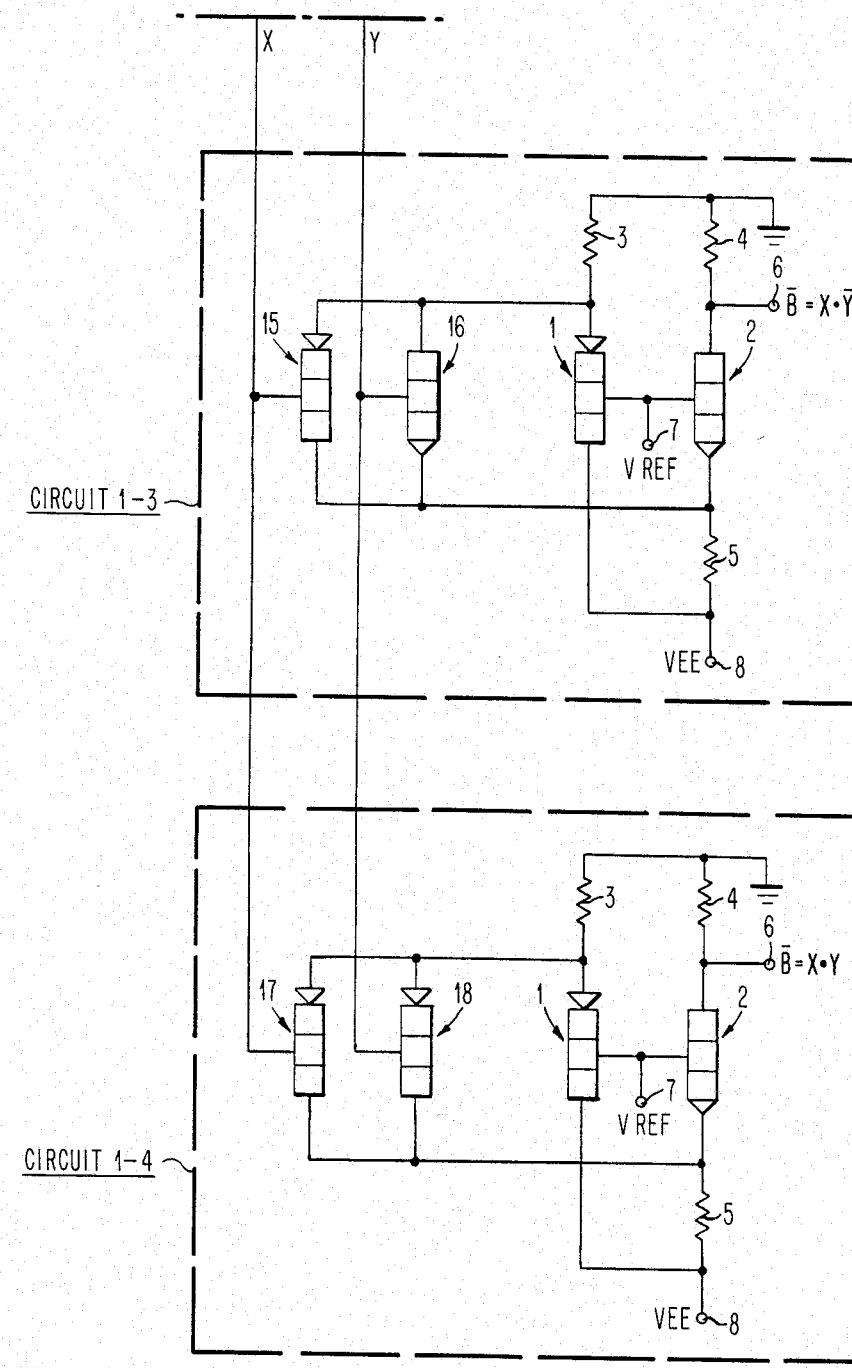

The complementary address decode circuit performs a complete decode function in only one logic level. It is depicted in two versions. One version of the decoder, in accordance with the invention (FIGS. 2, 3 and 4), provides an UP level output when selected. The other version of the decoder in accordance with the invention (FIGS. 1, 5 and 6) provides a DOWN level output when selected.

Reference is made to FIG. 1 of the drawing and to Table No. 1 set-forth below.

TABLE No. 1

| Binary Inputs of Decoder | | Selected Output Function | Decoder Output $\overline{B}$ | Selected Circuit Shown In |
|---|---|---|---|---|
| X | Y | | | (see also decoder of FIG. 1) |
| 0 | 0 | $\overline{X}\cdot\overline{Y}$ | 0 | FIG. 1A (circuit 1-1) |
| 0 | 1 | $\overline{X}\cdot Y$ | 0 | FIG. 1A (circuit 1-2) |
| 1 | 0 | $X\cdot\overline{Y}$ | 0 | FIG. 1B (circuit 1-3) |
| 1 | 1 | $X\cdot Y$ | 0 | FIG. 1B (circuit 1-4) |

Referring to Table No. 1, the left column designates the binary values of the decode circuit inputs X and Y required to select a designated one of the four outputs of the decoder. The second column from the left in Table No. 1 enumerates the binary output function of each of the four selected outputs. The third column from the left in the Table shows that each of the four selectable outputs, when selected, manifests a binary "0", i.e., a DOWN level. In the right column, the four similar logic circuits of the decode circuit shown in FIG. 1 are enumerated by specific figure references together with the legend the circuits bear in the drawing, for example, "FIG. 1A (circuit 1-1)", etc.

Still referring to Table No. 1 and the decode circuit of FIG. 1, it will be apparent that a decoder binary input of $X=1$ and $Y=0$ will result in the output of logic circuit "FIG. 1B (circuit 1-3)" being selected. The selected output will be the logical function $\overline{B}=X\cdot\overline{Y}$. The selected output is at a DOWN level, i.e., binary "0".

Reference is made to FIG. 1 and in particular to the logic circuit bearing the reference legend "Circuit 1-3". When the binary inputs to the decoder circuit are $X=1$ and $Y=0$, the base of transistor 15 is more positive than Vref and the base of transistor T16 is more negative than Vref. Accordingly, transistors 15 and 16 will each be "OFF". Transistor 2 will be "ON" and the current through resistor 4 will provide a voltage drop whereby the output terminal 6 (circuit 1-3) will be at a DOWN level, i.e., binary "0".

Still referring to FIG. 1 and in particular to the logic circuit bearing reference legend "Circuit 1-3", the operation thereof will be explained in detail below when the binary input to the decode circuit is $X=1$ and $Y=1$. When the input to circuit 1-3 is $X=1$ and $Y=1$, transistors 15, 1 and 2 will be off and transistor 16 will be on. With transistor 16 on, current flows from ground, through resistor 3, transistor 16 and resistor 5 into terminal 8. The resulting voltage drop across resistor 5 turns transistor 2 off and output terminal 6 goes to an up level. The resulting voltage drop across resistor 3 turns transistor 1 off.

Still referring to FIG. 1 and in particular to the logic circuit bearing the reference legend "Circuit 1-3", the operation thereof will be explained in detail when the binary input to the decode circuit is $X=0$ and $Y=0$. When the input to circuit 1-3 is $X=0$ and $Y=0$, transistor 15 will be on and transistors 16, 1 and 2 will be off. With transistor 15 on, current flows from ground, through resistor 3, transistor 15 and resistor 5 into terminal 8. The resulting voltage drop across resistor 5 turns transistor 2 off and output terminal 6 goes to an up level. The resulting voltage drop across resistor 3 turns transistor 1 off.

Still referring to FIG. 1 and logic "Circuit 1-3", the operation thereof will be explained in detail when the binary input to the decode circuit is $X=0$ and $Y=1$. When the input to circuit 1-3 is $X=0$ and $Y=1$, both transistor 15 and transistor 16 will be on and transistors 1 and 2 will be off. With both transistors 15 and 16 on, current will flow from ground, through resistor 3, through both transistors 15 and 16 which will ideally each carry half of the current from resistor 3, and through resistor 5 into terminal 8. The resulting voltage drop across resistor 5 turns transistor 2 off and output terminal 6 goes to an up level. The resulting voltage drop across resistor 3 turns transistor 1 off.

Reference is made to FIG. 2 of the drawing and to Table No. 2 set-forth below.

TABLE No. 2

Figure 2B:
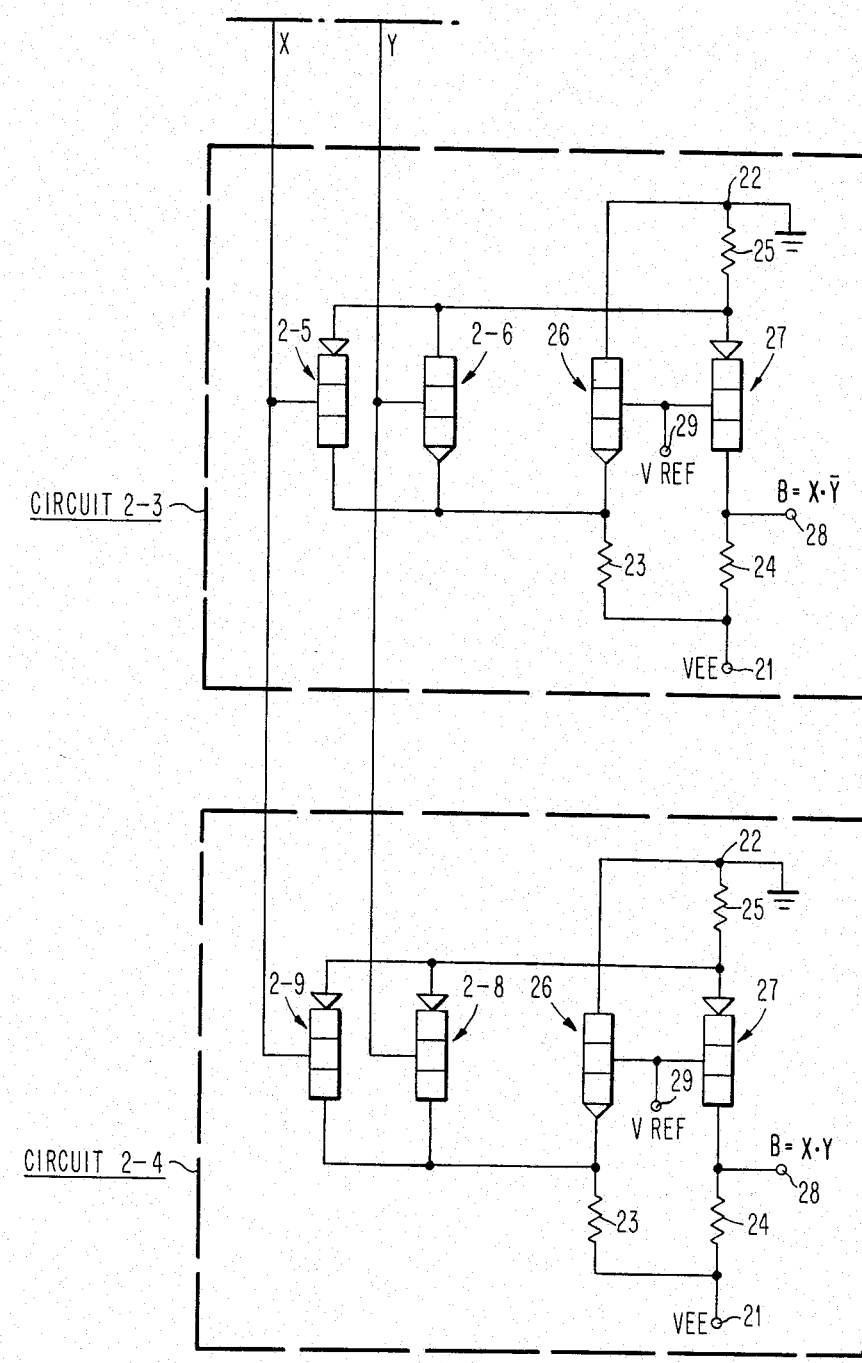

| Binary Inputs of Decoder | | Selected Output Function | Decoder Output B | Selected Circuit Shown In |
|---|---|---|---|---|
| X | Y | | | (see also decoder of FIG. 2) |
| 0 | 0 | $\overline{X}\cdot\overline{Y}$ | 1 | FIG. 2A (circuit 2-1) |
| 0 | 1 | $\overline{X}\cdot Y$ | 1 | FIG. 2A (circuit 2-2) |
| 1 | 0 | $X\cdot\overline{Y}$ | 1 | FIG. 2B (circuit 2-3) |
| 1 | 1 | $X\cdot Y$ | 1 | FIG. 2B (circuit 2-4) |

Referring to Table No. 2, the left column designates the binary values of the decode circuit inputs X and Y required to select a designated one of the four outputs of the decode circuit of FIG. 2. The second column from the left in Table No. 2 enumerates the binary output function of each of the four selected outputs. The third column from the left in the Table shows that each of the four selectable outputs, when selected manifests a binary "1", i.e., an UP level. In the right column, the four similar logic circuits of the decode circuit shown in FIG. 2 are enumerated by specific figure references together with the legend the circuit bears in the drawing, for example, "FIG. 2B (Circuit 2-2)", etc.

Still referring to Table No. 2, and the decode circuit of FIG. 2 it will be apparent that a decode circuit binary input of $X=0$ and $Y=1$ will result in the output of logic circuit FIG. 2A (circuit 2-2) to be selected. The selected output will be the logical function $B=\overline{X}\cdot Y$. The selected output, which is the output of logic "circuit 2-2" of the decode circuit of FIG. 2, will be at the UP level.

Reference is made to FIG. 2 and in particular to the logic circuit bearing reference legend "Circuit 2-2".

The operation of this logic circuit will be explained in detail below when the binary input to the decode circuit is X=1 and Y=0. When the input to current 2-2 is X=1, Y=0, both transistor 2-3 and transistor 2-4 will be on and transistors 26 and 27 will be off. With both transistors 2-3 and 2-4 on, current will flow from terminal 22, through resistor 25, through both transistors 2-3 and 2-4 which ideally will each carry half of the current from resistor 25, and through resistor 23 into terminal 21. The resulting voltage drop across resistor 25 turns transistor 27 off and output terminal 28 goes to a down level. The resulting voltage drop across resistor 23 turns transistor 26 off.

Still referring to FIG. 2 and in particular logic "circuit 2-2", the operation thereof will be explained in detail when the binary input to the decode circuit is X=0 and Y=0. When the input to circuit 2-2 is X=0 and Y=0, transistor 2-3 will be off and transistor 2-4 will be on. With transistor 2-4 on, current will flow from terminal 22, through resistor 25, transistor 2-4 and resistor 23 into terminal 21. The resulting voltage drop across resistor 25 turns transistor 27 off and output terminal 28 goes to a down level. The resulting voltage drop across resistor 23 turns transistor 26 off.

Again referring to FIG. 2 and in particular logic "circuit 2-2" the operation thereof will be explained in detail when the binary input to the decode circuit is X=1 and Y=1. When the input to circuit 2-2 is X=1 and Y=1, transistor 2-3 will be on and transistor 2-4 will be off. With transistor 2-3 on, current will flow from terminal 22, through resistor 25, transistor 2-3 and resistor 23 into terminal 21. The resulting voltage drop across resistor 25 turns transistor 27 off and output terminal 28 goes to a down level. The resulting voltage drop across resistor 23 turns transistor 26 off.

Reference is made to FIG. 3 of the drawing and to Table No. 3 set-forth below.

TABLE No. 3

(see also decoder of FIG. 3)

Figure 3B:
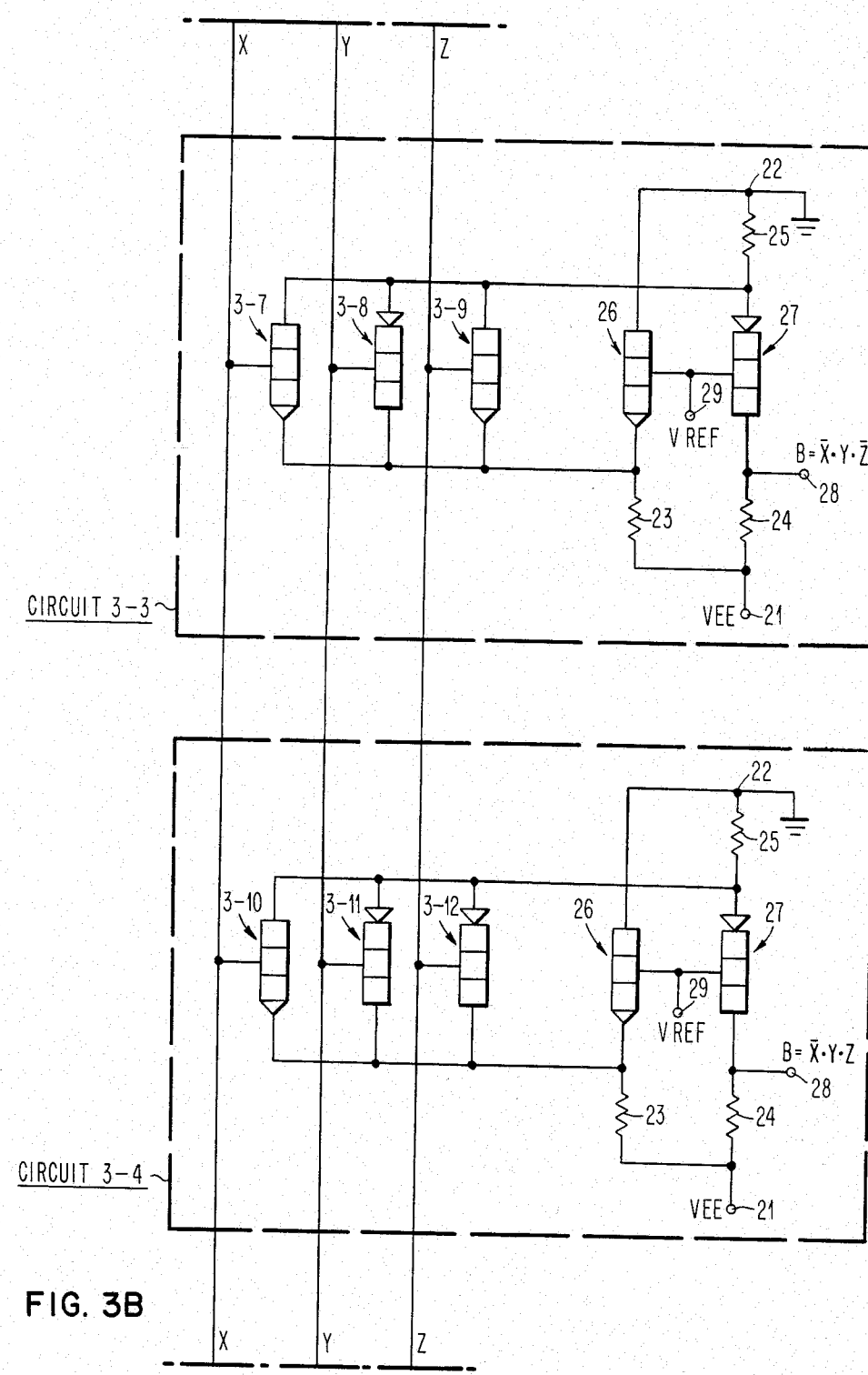
Figure 3C:
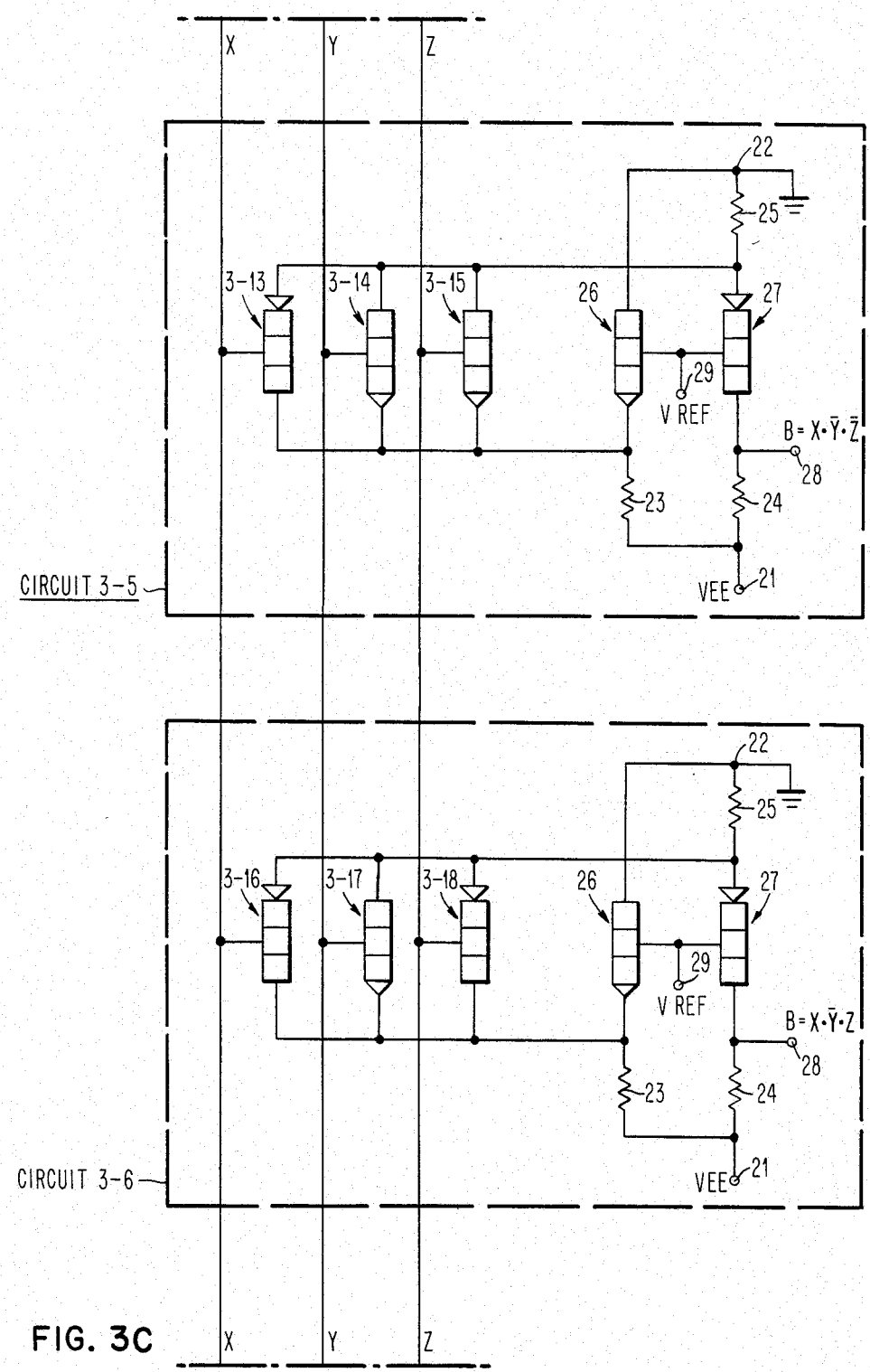
Figure 3D:
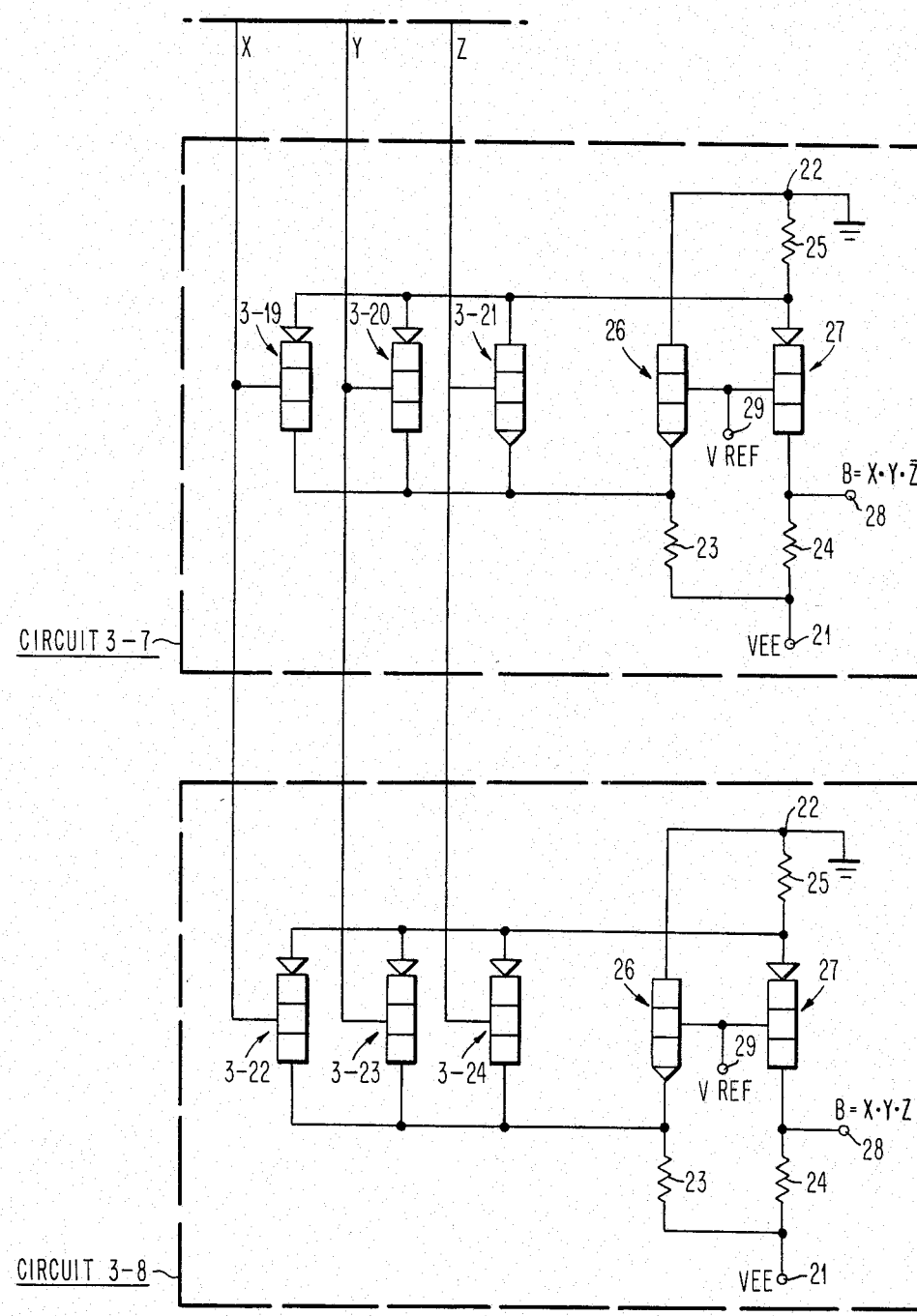

| Binary Inputs of Decoder | | | Selected Output Function | Decoder Output B | Selected Circuit Shown In |
|---|---|---|---|---|---|
| X | Y | Z | | | |
| 0 | 0 | 0 | $\bar{X} \cdot \bar{Y} \cdot \bar{Z}$ | 1 | FIG. 3A (circuit 3-1) |
| 0 | 0 | 1 | $\bar{X} \cdot \bar{Y} \cdot Z$ | 1 | FIG. 3A (circuit 3-2) |
| 0 | 1 | 0 | $\bar{X} \cdot Y \cdot \bar{Z}$ | 1 | FIG. 3B (circuit 3-3) |
| 0 | 1 | 1 | $\bar{X} \cdot Y \cdot Z$ | 1 | FIG. 3B (circuit 3-4) |
| 1 | 0 | 0 | $X \cdot \bar{Y} \cdot \bar{Z}$ | 1 | FIG. 3C (circuit 3-5) |
| 1 | 0 | 1 | $X \cdot \bar{Y} \cdot Z$ | 1 | FIG. 3C (circuit 3-6) |
| 1 | 1 | 0 | $X \cdot Y \cdot \bar{Z}$ | 1 | FIG. 3D (circuit 3-7) |
| 1 | 1 | 1 | $X \cdot Y \cdot Z$ | 1 | FIG. 3D (circuit 3-8) |

In Table No. 3, the left column designates the binary values of the decode circuit inputs X, Y and Z required to select a designated one of the eight outputs of the decode circuit of FIG. 3. The second column from the left in Table No. 3 enumerates the binary output function of each of the eight selectable outputs. The third column from the left in the Table shows that each of the eight selectable outputs, when selected, manifests a binary "1", i.e., an UP level. In the right column, the eight similar logic circuits of the decode circuit shown in FIG. 3 are enumerated by specific figure references together with the legend the circuit bears in the drawing for example "FIG. 3C (circuit 3-6)", etc.

Still referring to Table No. 3 and the decode circuit of FIG. 3 it will be apparent that a decode circuit binary input of X=1, Y=0 and Z=1 will result in the output of logic circuit of FIG. 3C (circuit 3-6) to be selected.

The selected output will be the logical function $B = X \bar{Y} Z$. The selected output, which is the output of logic "circuit 3-6" of the decode circuit of FIG. 3, will be at the UP level, i.e., binary "1".

Reference is made to FIG. 3 and logic "circuit 3-6". The operation of this logic circuit will be explained in detail below when the binary input to the decode circuit is X=1, Y=0 and Z=1. When the input to circuit 3-6 is X=1, Y=0 and Z=1, transistors 3-16, 3-17 and 3-18 will be off and transistors 26 and 27 will be on. With transistor 27 on, current will flow from terminal 22, through resistor 25, transistor 27 and resistor 24 into terminal 21. The resulting voltage drop across resistor 24 produces an up level at node 28. Current will also flow from terminal 22 through transistor 26 and resistor 23 into terminal 21.

Still referring to FIG. 3 and in particular to logic "circuit 3-6", the operation thereof will be explained in detail when the binary input to the decode circuit is X=1, Y=1 and Z=1. When the input to circuit 3-6 is X=1, Y=1 and Z=1, transistors 3-16, 3-18, 26 and 27 will be off and transistor 3-17 will be on. With transistor 3-17 on, current will flow from terminal 22, through resistor 25, transistor 3-17 and resistor 23 into terminal 21. The resulting voltage drop across resistor 25 turns transistor 27 off and terminal 28 goes to a down level. The resulting voltage drop across resistor 23 turns transistor 26 off.

Still referring to FIG. 3 and logic "circuit 36" the operation of the decode circuit (in particular logic "circuit 3-6" and logic "circuit 3-7") will be explained in detail when the binary input to the decode circuit is X=1, Y=1 and Z=0. When the input to circuit 3-6 is X=1, Y=1 and Z=0, transistors 3-16, 26 and 27 will be off and transistors 3-17 and 3-18 will be on. With both transistors 3-17 and 3-18 on, current will flow from terminal 22, through resistor 25, through both transistors 3-17 and 3-18, which ideally will each carry half of the current from resistor 25, and through resistor 23 into terminal 21. The resulting voltage drop across resistor 25 turns transistor 27 off and node 28 goes to a down level. The resulting voltage drop across resistor 23 turns transistor 26 off.

When the input to circuit 3-7 is X=1, Y=1 and Z=0, transistors 3-19, 3-20 and 3-21 will be off and transistors 26 and 27 will be on. With transistor 27 on current will flow from terminal 22, into resistor 25, transistor 27 and resistor 24 into terminal 21. The resulting voltage drop across resistor 24 produces an up level at node 28. Current will also flow from terminal 22 through transistor 26 and resistor 23 into terminal 21.

Reference is made to FIG. 4 of the drawing and to Table No. 4 set-forth below.

TABLE No. 4

(see also decoder of FIG. 4)

| Binary Inputs of Decoder | | | | | Selected Output Function | Decoder Output B | Selected Circuit Shown In |
|---|---|---|---|---|---|---|---|
| S | T | X | Y | Z | | | |
| 0 | 0 | 0 | 0 | 0 | $\bar{S} \cdot \bar{T} \cdot \bar{X} \cdot \bar{Y} \cdot \bar{Z}$ | 1 | FIG. 4 (circuit 4-1) |
| 0 | 0 | 0 | 0 | 1 | $\bar{S} \cdot \bar{T} \cdot \bar{X} \cdot \bar{Y} \cdot Z$ | 1 | (not shown) |
| 0 | 0 | 0 | 1 | 0 | $\bar{S} \cdot \bar{T} \cdot \bar{X} \cdot Y \cdot \bar{Z}$ | 1 | " |
| 0 | 0 | 0 | 1 | 1 | $\bar{S} \cdot \bar{T} \cdot \bar{X} \cdot Y \cdot Z$ | 1 | " |
| 0 | 0 | 1 | 0 | 1 | $\bar{S} \cdot \bar{T} \cdot X \cdot \bar{Y} \cdot Z$ | 1 | " |
| 0 | 0 | 1 | 1 | 0 | $\bar{S} \cdot \bar{T} \cdot X \cdot Y \cdot \bar{Z}$ | 1 | " |
| 0 | 0 | 1 | 1 | 1 | $\bar{S} \cdot \bar{T} \cdot X \cdot Y \cdot Z$ | 1 | FIG. 4 (circuit 4-8) |
| 0 | 1 | 0 | 0 | 0 | $\bar{S} \cdot T \cdot \bar{X} \cdot \bar{Y} \cdot \bar{Z}$ | 1 | (not shown) |

TABLE No. 4-continued (see also decoder of FIG. 4)

| Binary Inputs of Decoder | | | | | Selected Output Function | Decoder Output B | Selected Circuit Shown In |
|---|---|---|---|---|---|---|---|
| S | T | X | Y | Z | | | |
| 0 | 1 | 0 | 0 | 1 | $\overline{S} \cdot T \cdot \overline{X} \cdot \overline{Y} \cdot Z$ | 1 | " |
| 0 | 1 | 0 | 1 | 0 | $\overline{S} \cdot T \cdot \overline{X} \cdot Y \cdot \overline{Z}$ | 1 | " |
| 0 | 1 | 0 | 1 | 1 | $\overline{S} \cdot T \cdot \overline{X} \cdot Y \cdot Z$ | 1 | " |
| 0 | 1 | 1 | 0 | 0 | $\overline{S} \cdot T \cdot X \cdot \overline{Y} \cdot \overline{Z}$ | 1 | " |
| 0 | 1 | 1 | 0 | 1 | $\overline{S} \cdot T \cdot X \cdot \overline{Y} \cdot Z$ | 1 | " |
| 0 | 1 | 1 | 1 | 0 | $\overline{S} \cdot T \cdot X \cdot Y \cdot \overline{Z}$ | 1 | " |
| 0 | 1 | 1 | 1 | 1 | $\overline{S} \cdot T \cdot X \cdot Y \cdot Z$ | 1 | FIG. 4 (circuit 4-16) |
| 1 | 0 | 0 | 0 | 0 | $S \cdot \overline{T} \cdot \overline{X} \cdot \overline{Y} \cdot \overline{Z}$ | 1 | (not shown) |
| 1 | 0 | 0 | 0 | 1 | $S \cdot \overline{T} \cdot \overline{X} \cdot \overline{Y} \cdot Z$ | 1 | " |
| 1 | 0 | 0 | 1 | 0 | $S \cdot \overline{T} \cdot \overline{X} \cdot Y \cdot \overline{Z}$ | 1 | " |
| 1 | 0 | 0 | 1 | 1 | $S \cdot \overline{T} \cdot \overline{X} \cdot Y \cdot Z$ | 1 | " |
| 1 | 0 | 1 | 0 | 0 | $S \cdot \overline{T} \cdot X \cdot \overline{Y} \cdot \overline{Z}$ | 1 | " |
| 1 | 0 | 1 | 0 | 1 | $S \cdot \overline{T} \cdot X \cdot \overline{Y} \cdot Z$ | 1 | " |
| 1 | 0 | 1 | 1 | 0 | $S \cdot \overline{T} \cdot X \cdot Y \cdot \overline{Z}$ | 1 | " |
| 1 | 0 | 1 | 1 | 1 | $S \cdot \overline{T} \cdot X \cdot Y \cdot Z$ | 1 | " |
| 1 | 1 | 0 | 0 | 0 | $S \cdot T \cdot \overline{X} \cdot \overline{Y} \cdot \overline{Z}$ | 1 | " |
| 1 | 1 | 0 | 0 | 1 | $S \cdot T \cdot \overline{X} \cdot \overline{Y} \cdot Z$ | 1 | " |
| 1 | 1 | 0 | 1 | 0 | $S \cdot T \cdot \overline{X} \cdot Y \cdot \overline{Z}$ | 1 | " |
| 1 | 1 | 0 | 1 | 1 | $S \cdot T \cdot \overline{X} \cdot Y \cdot Z$ | 1 | " |
| 1 | 1 | 1 | 0 | 0 | $S \cdot T \cdot X \cdot \overline{Y} \cdot \overline{Z}$ | 1 | " |
| 1 | 1 | 1 | 0 | 1 | $S \cdot T \cdot X \cdot \overline{Y} \cdot Z$ | 1 | " |
| 1 | 1 | 1 | 1 | 0 | $S \cdot T \cdot X \cdot Y \cdot \overline{Z}$ | 1 | " |
| 1 | 1 | 1 | 1 | 1 | $S \cdot T \cdot X \cdot Y \cdot Z$ | 1 | FIG. 4 (circuit 4-32) |

Figure 4A:
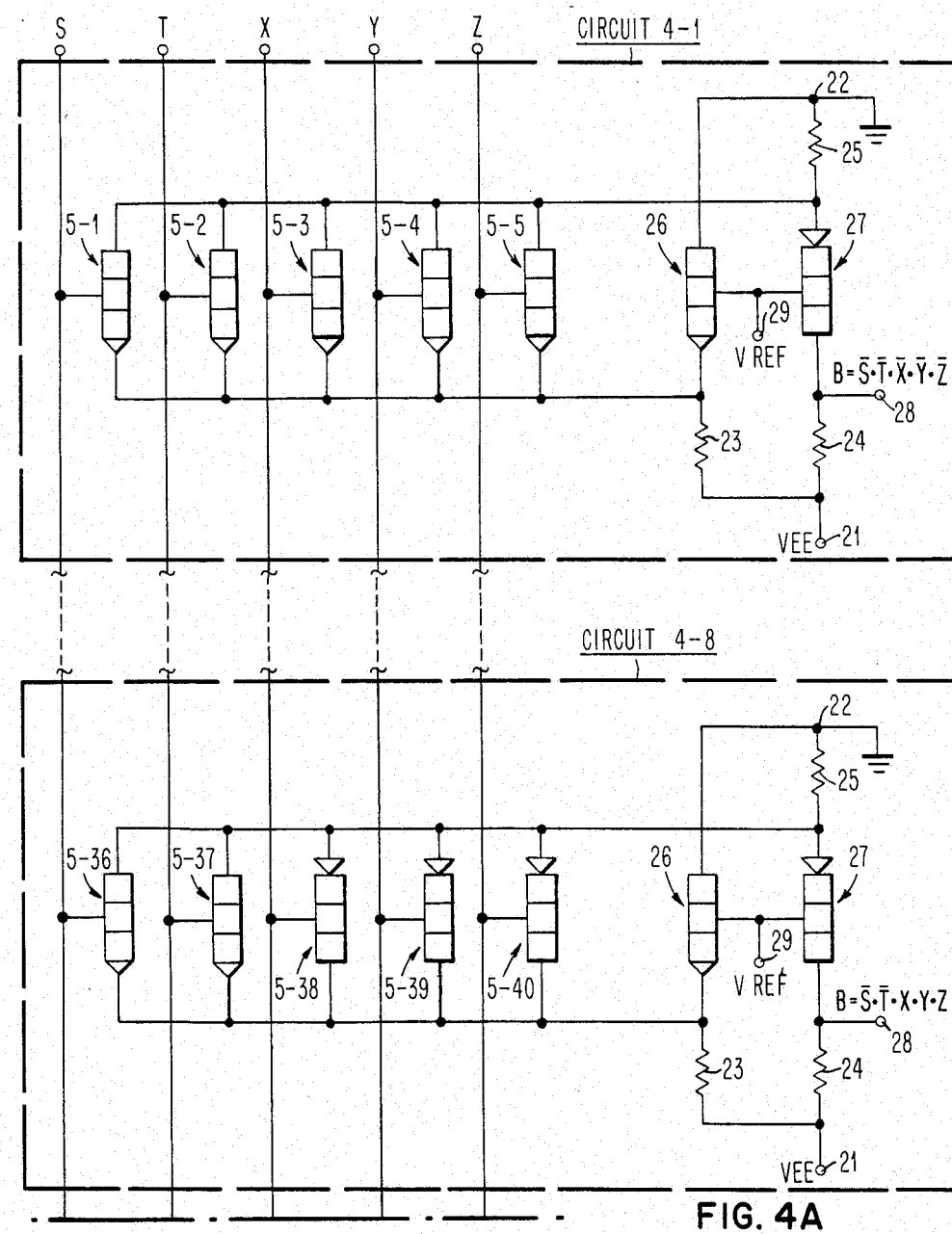
FIGS. 4A and 4B placed together as shown in FIG. 4 depict a five binary input decode circuit, in accordance with the invention, wherein the selected output [one out of thirty-two (only four shown)] is at an UP level. Shown in FIG. 4 are only four of the thirty-two similar logic circuits. The four similar logic circuits shown in FIG. 4 respectively bear the legends "Circuit 4-1", "Circuit 4-8", "Circuit 4-16" and "Circuit 4-32".
Figure 4B:
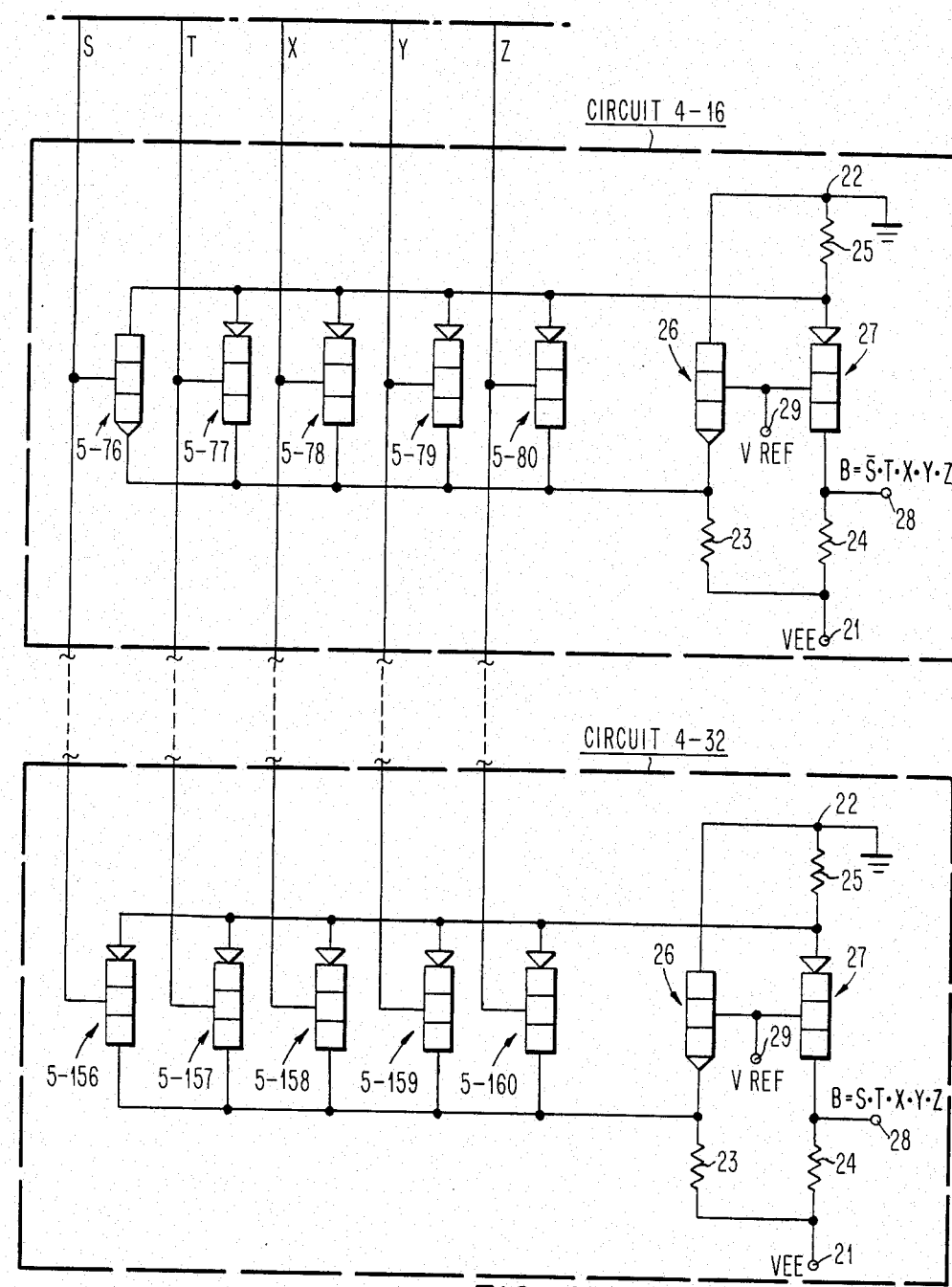

In Table No. 4, the left column designates the binary values of the decode circuit inputs S, T, X, Y and Z required to select a designated one of the thirty-two (only four shown in FIG. 4) outputs of the decode circuit of FIG. 4. The second column from the left in Table No. 4 enumerates the binary output function of each of the thirty-two selectable outputs. The third column from the left in the Table shows that each of the thirty-two selectable outputs when selected, manifests a binary "1", i.e., an UP level. In the right column the thirty-two similar logic circuits of the decode circuit shown in FIG. 4 are designated. (However, only four of the thirty-two similar logic circuits are shown in the drawing and expressly identified in Table No. 4 by Figure number and reference legend, namely, "FIG. 4A "(circuit 4-1)", "FIG. 4A "(circuit 4-8)", FIG. 4B "(circuit 4-16)" and FIG. 4B "(circuit 4-32)".

Now referring to FIG. 4 and logic "circuit 48", the operation of the decode circuit will be explained in detail when the binary input to the decode circuit is S=0, T=0, X=1, Y=1 and Z=1. When the input to circuit 4-8 is S=0, T=0, X=1, Y=1 and Z=1, transistors 5-36, 5-37, 5-38, 5-39 and 5-40 will be off and transistors 26 and 27 will be on. With transistor 27 on, current will flow from terminal 22, through resistor 25, transistor 27 and resistor 24 into terminal 21. The resulting voltage drop across resistor 24 produces an up level at terminal 28. Current will also flow from terminal 22 through transistor 26 and resistor 23 into terminal 21.

In a further reference to FIG. 4 and logic "circuit 4-8" the operation of the decode circuit will be explained in detail when the binary input to the decode circuit is S=1, T=0, X=1, Y=1 and Z=1. When the input to circuit 4-8 is S=1, T=0, X=1, Y=1 and Z=1, transistors 5-37, 5-38, 5-39, 5-40, 26 and 27 will be off. With transistor 5-36 on, current will flow from terminal 22, through resistor 25, transistor 5-36 and resistor 23 into termainl 21. The resulting voltage drop across resistor 25 turns transistor 27 off and terminal 28 goes to a down level. The resulting voltage drop across resistor 23 turns transistor 26 off.

In a yet further reference to FIG. 4 and logic "circuit 4-8" the operation of the decode circuit will be explained in detail when the binary input to the decode circuit is S=0, T=0, X=1, Y=1 and Z=0. When the input to circuit 4-8 is S=0, T=0, X=1, 1 Y=1 and Z=0, transistors 5-36, 5-37, 5-38, 5-39, 26 and 27 will be off and transistor 5-40 will be on. With transistor 5-40 on, current will flow from terminal 22, through resistor 25, transistor 5-40 and resistor 23 into terminal 21. The resulting voltage drop across resistor 25 turns transistor 27 off and terminal 28 goes to a down level. The resulting voltage drop across resistor 23 turns transistor 26 off.

Figures 5, 5A:
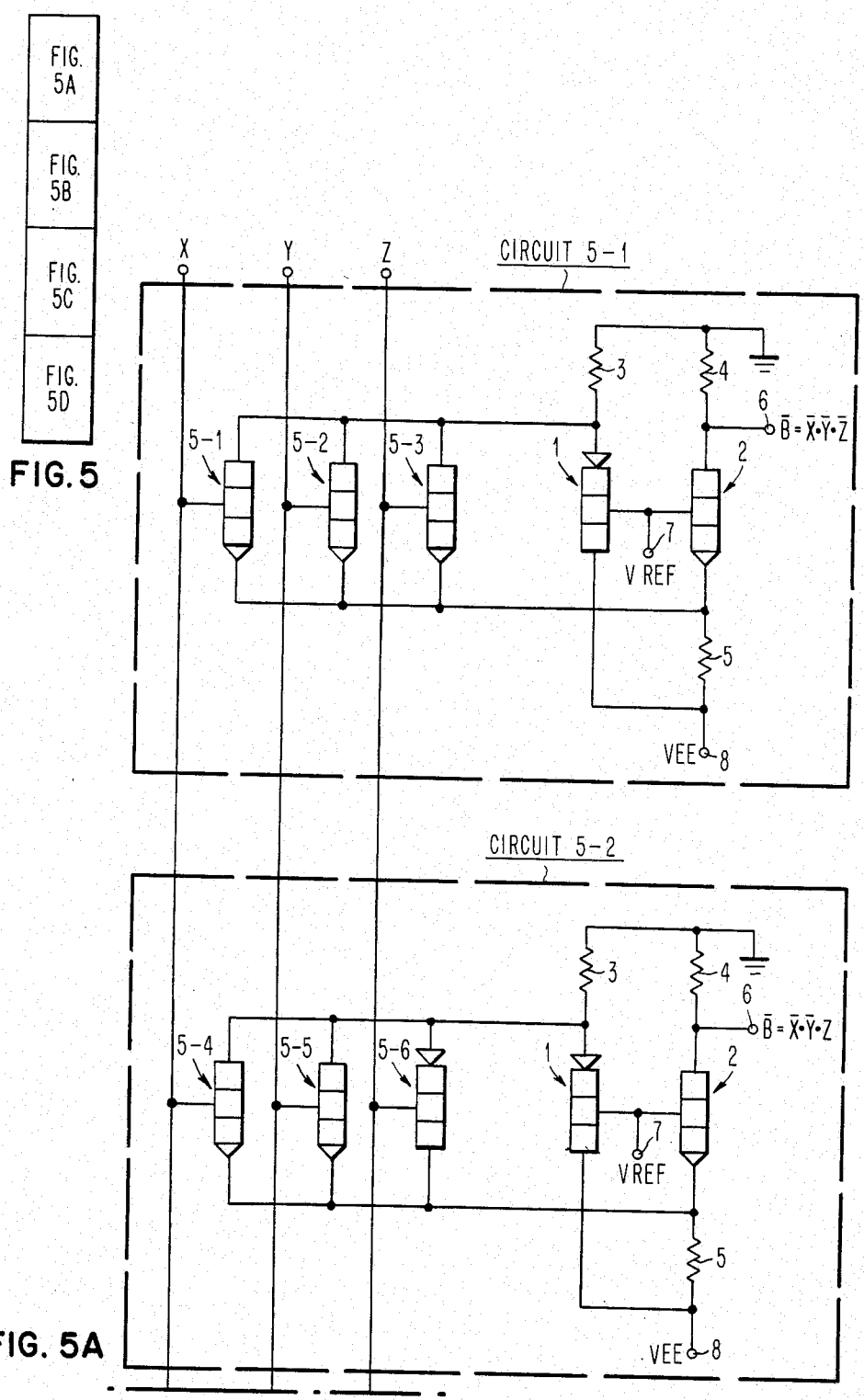
FIGS. 5A, 5B, 5C and 5D placed together as shown in FIG. 5 disclose a three binary input decode circuit, in accordance with the invention, wherein the selected output (one out of eight) is a DOWN level. Shown in FIG. 5 are eight similar logic circuits respectively bearing the legends "Circuit 5-1", "Circuit 5-2", . . . "Circuit 5-7" and "Circuit 5-8".

Reference is made to FIG. 5 of the drawing and to Table No. 5 set-forth below.

TABLE No. 5

(see also decoder of FIG. 5)

Figure 5B:
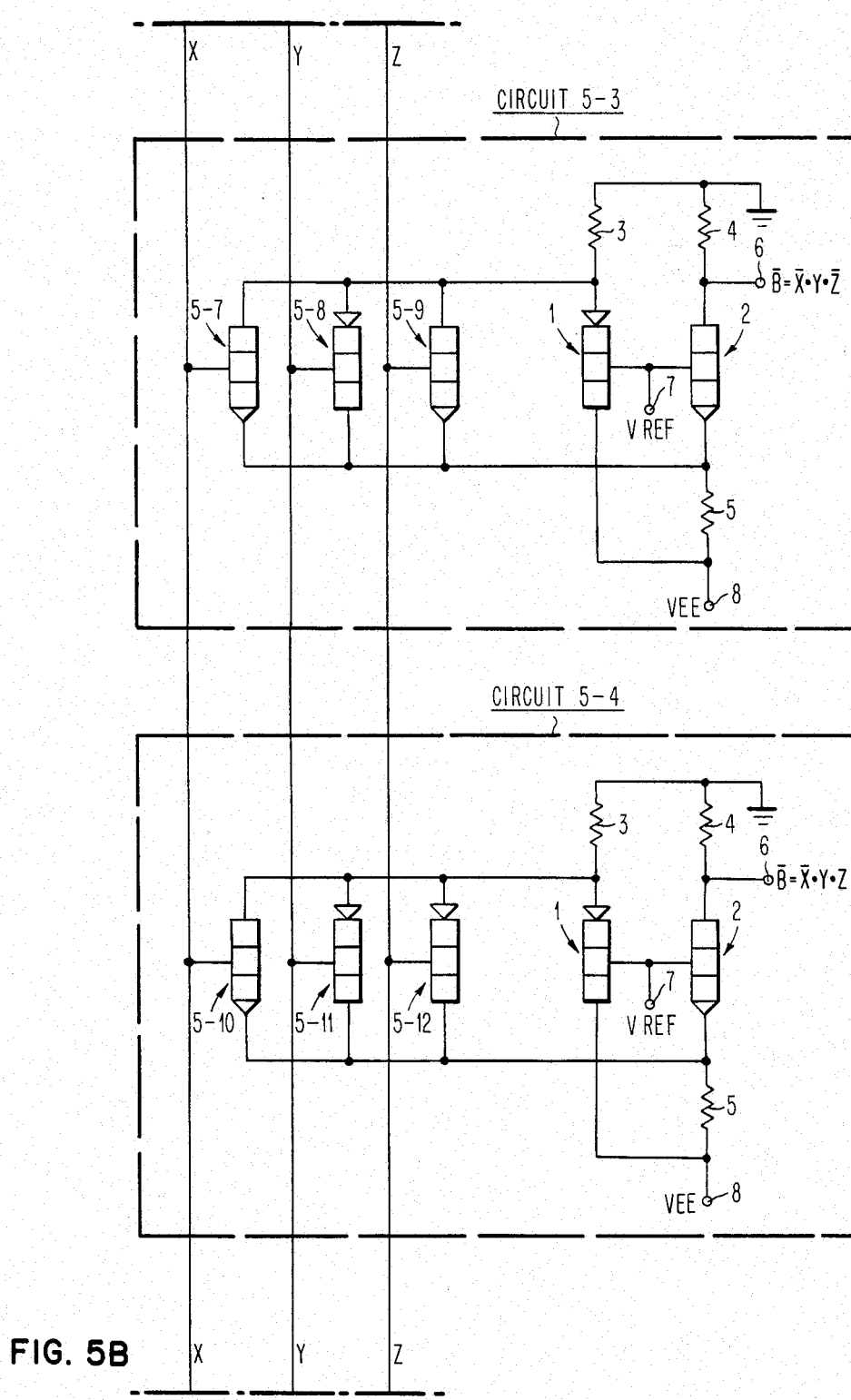
Figure 5C:
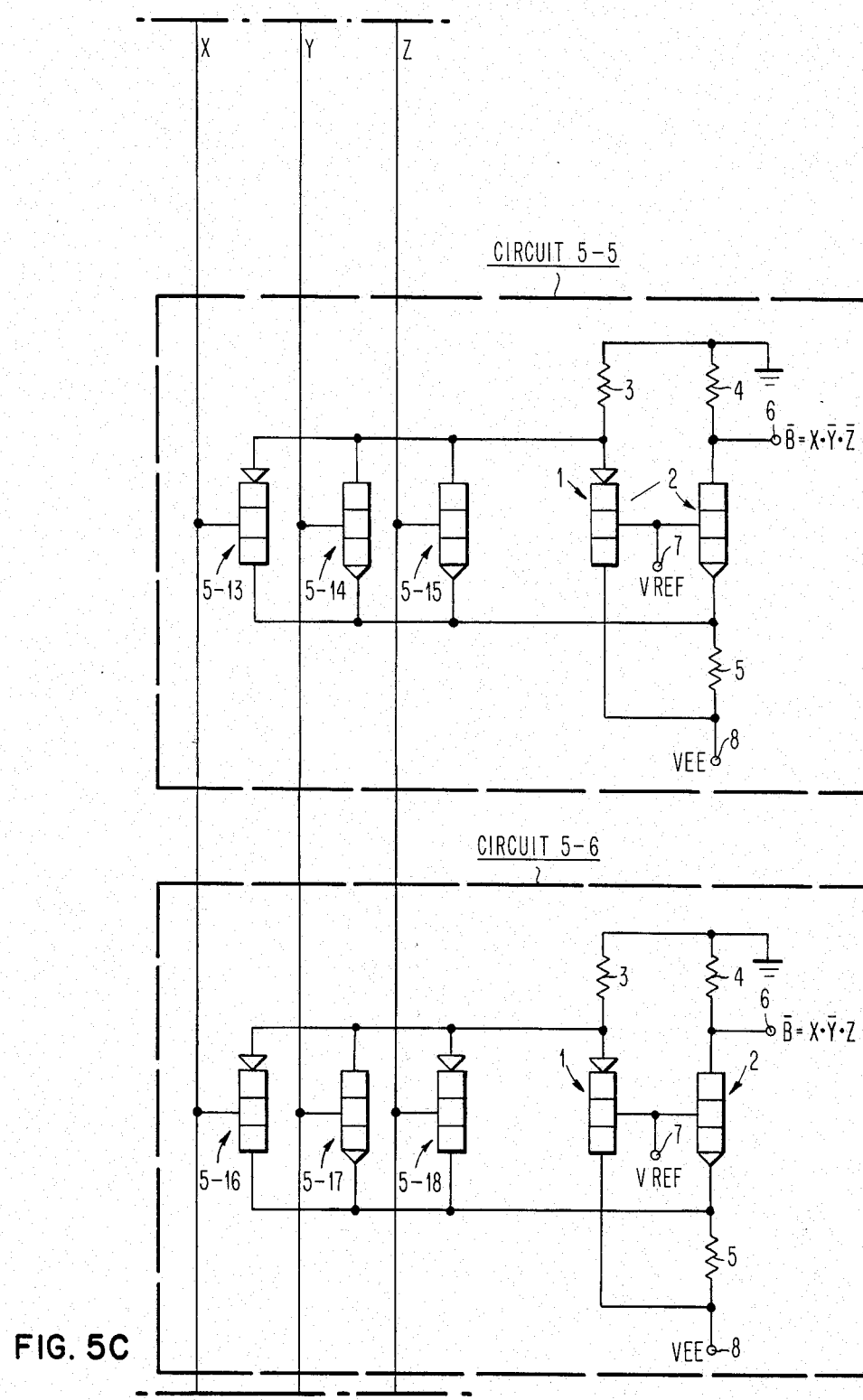
Figure 5D:
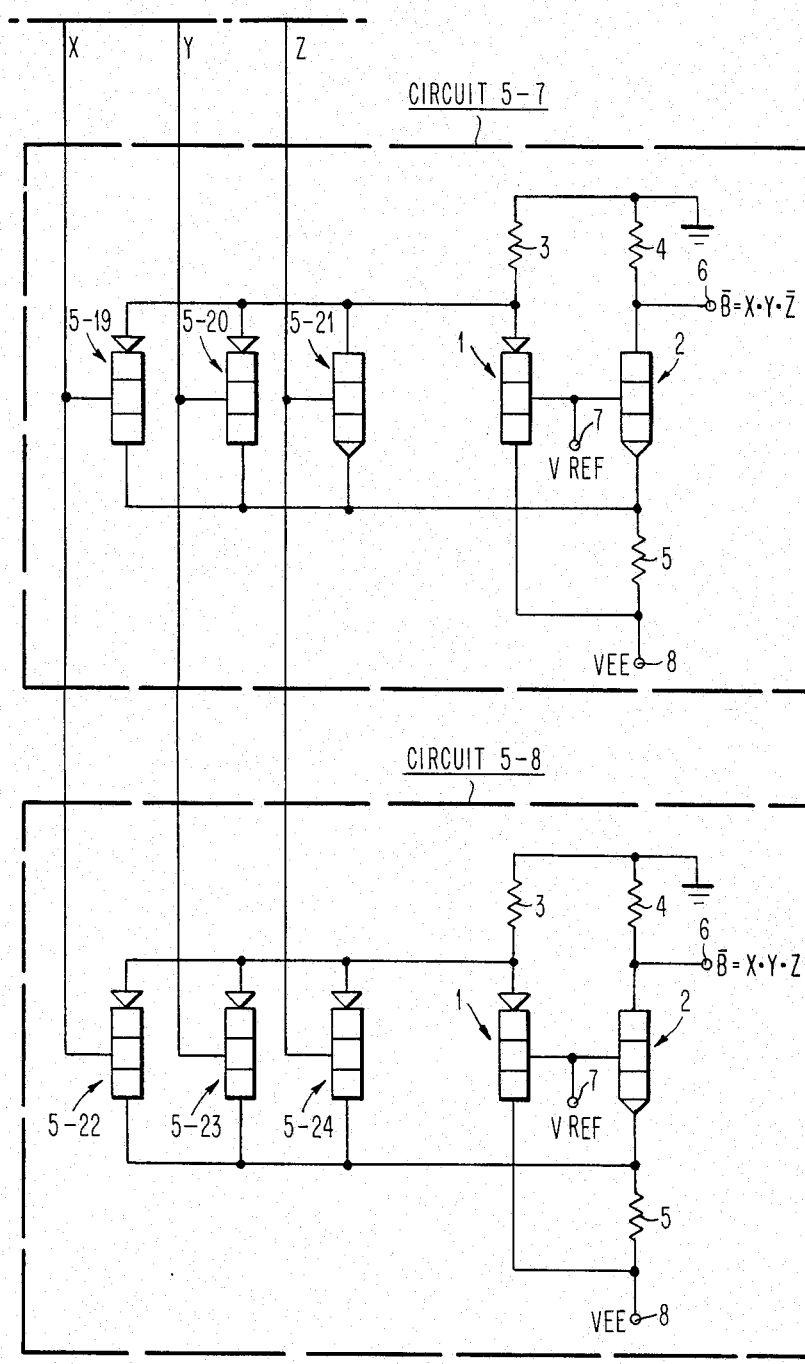

| Binary Inputs | | | Selected Output Function | Decoder Output $\overline{B}$ | Selected Circuit Shown In |
|---|---|---|---|---|---|
| X | Y | Z | | | |
| 0 | 0 | 0 | $\overline{X} \cdot \overline{Y} \cdot \overline{Z}$ | 0 | FIG. 5A (circuit 5-1) |
| 0 | 0 | 1 | $\overline{X} \cdot \overline{Y} \cdot Z$ | 0 | FIG. 5A (circuit 5-2) |
| 0 | 1 | 0 | $\overline{X} \cdot Y \cdot \overline{Z}$ | 0 | FIG. 5B (circuit 5-3) |
| 0 | 1 | 1 | $\overline{X} \cdot Y \cdot Z$ | 0 | FIG. 5B (circuit 5-4) |
| 1 | 0 | 0 | $X \cdot \overline{Y} \cdot \overline{Z}$ | 0 | FIG. 5C (circuit 5-5) |
| 1 | 0 | 1 | $X \cdot \overline{Y} \cdot Z$ | 0 | FIG. 5C (circuit 5-6) |
| 1 | 1 | 0 | $X \cdot Y \cdot \overline{Z}$ | 0 | FIG. 5D (circuit 5-7) |
| 1 | 1 | 1 | $X \cdot Y \cdot Z$ | 0 | FIG. 5D (circuit 5-8) |

In Table No. 5 the left column designates the binary values of the decode circuit inputs X, Y and Z required to select a designated one of the eight outputs of the decode circuit of FIG. 5. The second column from the left in Table 5 enumerates the binary output function of each of the eight selectable outputs. The third column from the left in the table shows the eight selectable outputs that when selected manifest a binary "0", i.e., a DOWN level. In the right column the eight similar logic circuits of the decode circuit shown in FIG. 5 are eneumerated by specific figure references together with the legend the circuit bears in the drawing, for example "FIG. 5A (circuit 5-1)", "FIG. 5A (circuit 5-2)", etc.

Now by way of explanation, referring to FIG. 5 and Table No. 5, assume the input to the decode circuit is X=0, Y=0 and Z=0. It will be seen that logic "circuit 5-1" of the decoder will be selected to provide the output function $\overline{X} \cdot \overline{Y} \cdot 0VS/Z/$ at output B thereof. Namely, the output of the selected logic "circuit 5-1" is a binary "0", i.e., DOWN level, whereas the remaining (unselected) seven outputs of the decode circuit are each a binary "1", i.e., an UP level.

Correspondingly, by way of further explanation, still referring to FIG. 5 and Table No. 5, when the input to the decode circuit is X=1, Y=1 and Z=0, the logic "circuit 5-7" of the decoder will be selected to provide the output function $X \cdot Y \cdot \overline{Z}$ at output $\overline{B}$ thereof. Namely, the output of the logic "circuit 5-7" is a binary "0", i.e., DOWN level, whereas the remaining seven outputs of the decode circuit are each at a binary "1", i.e., UP level.

Reference is made to FIG. 6 of the drawing and to Table No. 6 set-forth below.

TABLE No. 6

(see also decoder of FIG. 6)

Figure 6A:
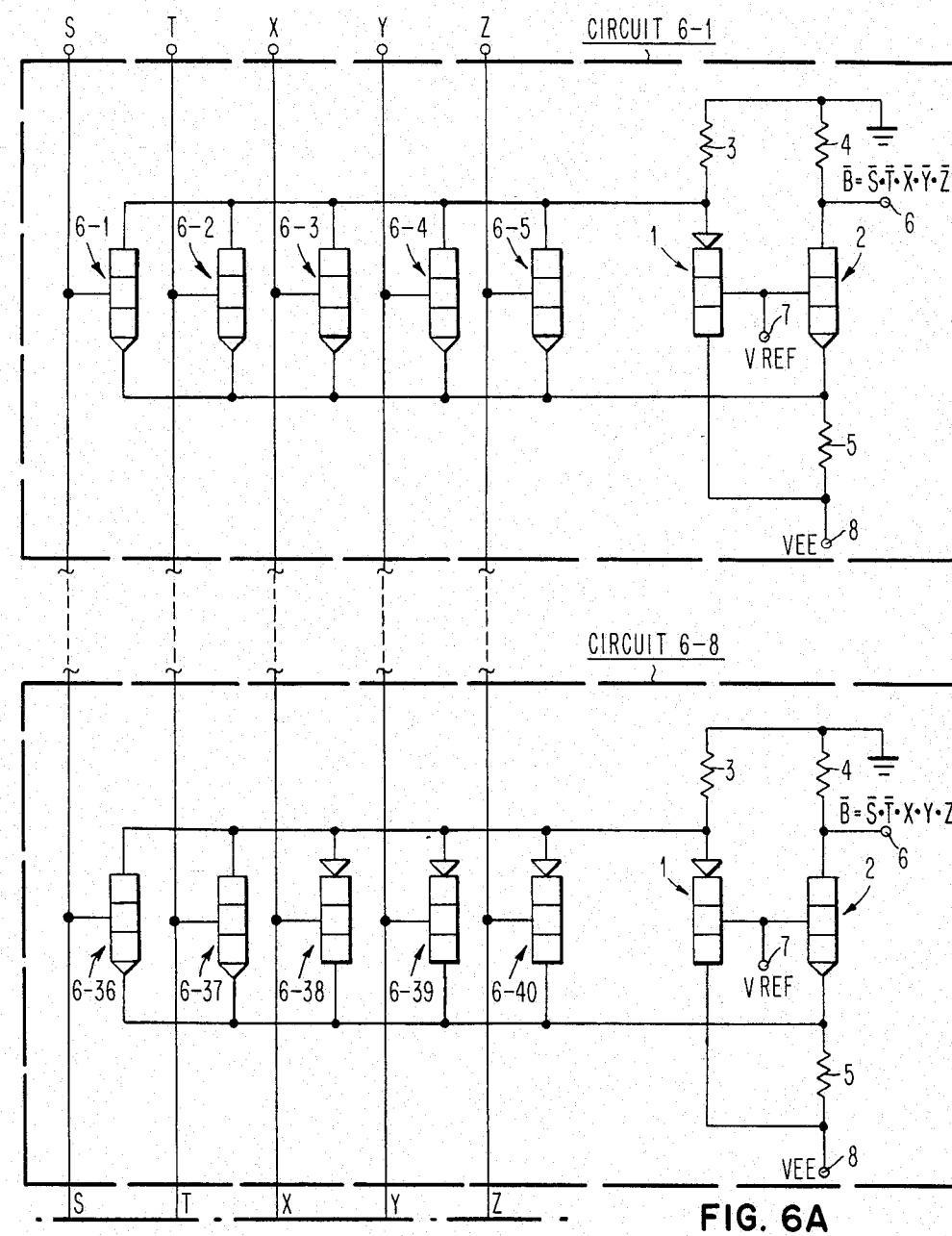
FIGS. 6A and 6B placed together as shown in FIG. 6 depict a five binary input decode circuit, in accordance with the invention, wherein the selected output [one out of thirty-two (only four shown)] is at a DOWN level. Shown in FIG. 6 are only four of the thirty-two similar logic circuits. The four similar logic circuits shown in FIG. 6 respectively bear the legends "Circuit 6-1", "Circuit 6-8", "Circuit 6-16" and "Circuit 6-32".
Figure 6B:
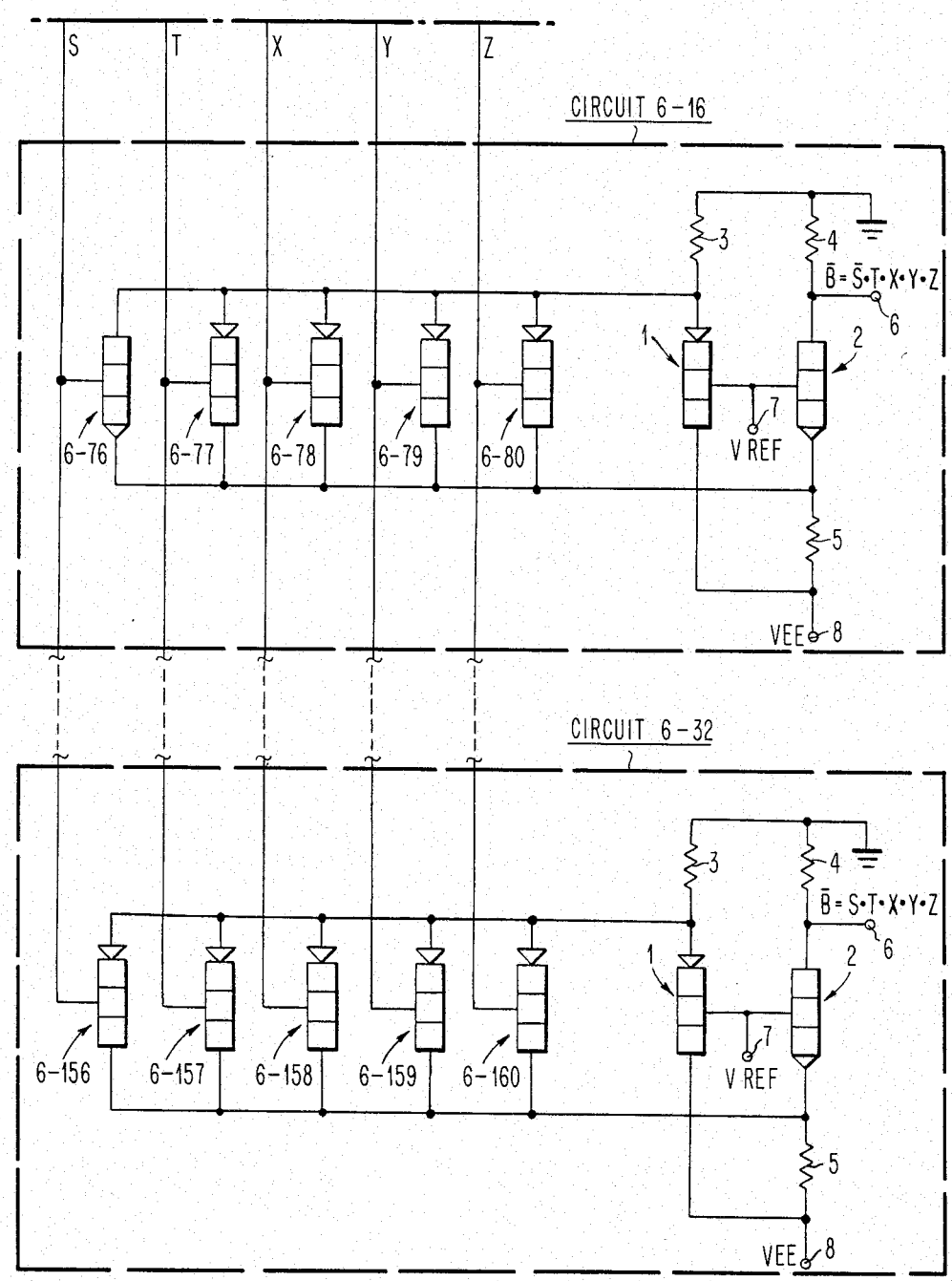

| Binary Inputs of Decoder S T X Y Z | Selected Output Function | Decoder Output $\bar{B}$ | Selected Circuit Shown In |
|---|---|---|---|
| 0 0 0 0 0 | $\bar{S}\cdot\bar{T}\cdot\bar{X}\cdot\bar{Y}\cdot\bar{Z}$ | 0 | FIG. 6A (circuit 6-1) |
| 0 0 0 0 1 | $\bar{S}\cdot\bar{T}\cdot\bar{X}\cdot\bar{Y}\cdot Z$ | 0 | (not shown) |
| 0 0 0 1 0 | $\bar{S}\cdot\bar{T}\cdot\bar{X}\cdot Y\cdot\bar{Z}$ | 0 | " |
| 0 0 0 1 1 | $\bar{S}\cdot\bar{T}\cdot\bar{X}\cdot Y\cdot Z$ | 0 | " |
| 0 0 1 0 0 | $\bar{S}\cdot\bar{T}\cdot X\cdot\bar{Y}\cdot\bar{Z}$ | 0 | " |
| 0 0 1 0 1 | $\bar{S}\cdot\bar{T}\cdot X\cdot\bar{Y}\cdot Z$ | 0 | " |
| 0 0 1 1 0 | $\bar{S}\cdot\bar{T}\cdot X\cdot Y\cdot\bar{Z}$ | 0 | " |
| 0 0 1 1 1 | $\bar{S}\cdot\bar{T}\cdot X\cdot Y\cdot Z$ | 0 | FIG. 6A (circuit 6-8) |
| 0 1 0 0 0 | $\bar{S}\cdot T\cdot\bar{X}\cdot\bar{Y}\cdot\bar{Z}$ | 0 | (not shown) |
| 0 1 0 0 1 | $\bar{S}\cdot T\cdot\bar{X}\cdot\bar{Y}\cdot Z$ | 0 | " |
| 0 1 0 1 0 | $\bar{S}\cdot T\cdot\bar{X}\cdot Y\cdot\bar{Z}$ | 0 | " |
| 0 1 0 1 1 | $\bar{S}\cdot T\cdot\bar{X}\cdot Y\cdot Z$ | 0 | " |
| 0 1 1 0 0 | $\bar{S}\cdot T\cdot X\cdot\bar{Y}\cdot\bar{Z}$ | 0 | " |
| 0 1 1 0 1 | $\bar{S}\cdot T\cdot X\cdot\bar{Y}\cdot Z$ | 0 | " |
| 0 1 1 1 0 | $\bar{S}\cdot T\cdot X\cdot Y\cdot\bar{Z}$ | 0 | " |
| 0 1 1 1 1 | $\bar{S}\cdot T\cdot X\cdot Y\cdot Z$ | 0 | FIG. 6B (ckt. 6-16) |
| 1 0 0 0 0 | $S\cdot\bar{T}\cdot\bar{X}\cdot\bar{Y}\cdot\bar{Z}$ | 0 | (not shown) |
| 1 0 0 0 1 | $S\cdot\bar{T}\cdot\bar{X}\cdot\bar{Y}\cdot Z$ | 0 | " |
| 1 0 0 1 0 | $S\cdot\bar{T}\cdot\bar{X}\cdot Y\cdot\bar{Z}$ | 0 | " |
| 1 0 0 1 1 | $S\cdot\bar{T}\cdot\bar{X}\cdot Y\cdot Z$ | 0 | " |
| 1 0 1 0 0 | $S\cdot\bar{T}\cdot X\cdot\bar{Y}\cdot\bar{Z}$ | 0 | " |
| 1 0 1 0 1 | $S\cdot\bar{T}\cdot X\cdot\bar{Y}\cdot Z$ | 0 | " |
| 1 0 1 1 0 | $S\cdot\bar{T}\cdot X\cdot Y\cdot\bar{Z}$ | 0 | " |
| 1 0 1 1 1 | $S\cdot\bar{T}\cdot X\cdot Y\cdot Z$ | 0 | " |
| 1 1 0 0 0 | $S\cdot T\cdot\bar{X}\cdot\bar{Y}\cdot\bar{Z}$ | 0 | " |
| 1 1 0 0 1 | $S\cdot T\cdot\bar{X}\cdot\bar{Y}\cdot Z$ | 0 | " |
| 1 1 0 1 0 | $S\cdot T\cdot\bar{X}\cdot Y\cdot\bar{Z}$ | 0 | " |
| 1 1 0 1 1 | $S\cdot T\cdot\bar{X}\cdot Y\cdot Z$ | 0 | " |
| 1 1 1 0 0 | $S\cdot T\cdot X\cdot\bar{Y}\cdot\bar{Z}$ | 0 | " |
| 1 1 1 0 1 | $S\cdot T\cdot X\cdot\bar{Y}\cdot Z$ | 0 | " |
| 1 1 1 1 0 | $S\cdot T\cdot X\cdot Y\cdot\bar{Z}$ | 0 | " |
| 1 1 1 1 1 | $S\cdot T\cdot X\cdot Y\cdot Z$ | 0 | FIG. 6B (ckt. 6-32) |

In Table No. 6, the left column designates the binary values of the decode circuit inputs S, T, X, Y and Z required to select a designated one of the thirty-two (only four shown in FIG. 6) outputs of the decode circuit of FIG. 6. The second column from the left in Table No. 6 enumerates the binary output function of each of the thirty-two selectable outputs. The third column from the left in the Table shows that each of the thirty-two selectable outputs, when selected, manifests a binary "0", i.e., a DOWN level. In the right column the thirty-two similar logic circuits of the decode circuit shown in FIG. 6 are designed. [However, only four of the thirty-two similar logic circuits are shown in the drawing and expressly identified in Table No. 6 by Figure number and reference legend. Namely, "FIG. 6A (circuit 6-1)", "FIG. 6A (circuit 6-8)", "FIG. 6B (circuit 6-16)" and "FIG. 6B (circuit 6-32)".]

Now by way of explanation, referring to FIG. 6 and Table No. 6, assume the input to the decode circuit is S=0, T=0, X=0, U=0 and Z=0. It will be seen that logic "circuit 6-1" of the decoder will be selected to provide the output function $\bar{S}\cdot\bar{T}\cdot\bar{X}\cdot\bar{Y}\cdot\bar{Z}$ at output $\bar{B}$ thereof. Namely, the output of the selected logic "circuit 6-1" is a binary "0", i.e., DOWN level, whereas, the remaining thirty-one (unselected) outputs of the decode circuit are each a binary "1", i.e., an UP level.

Still referring to FIG. 6 and Table No. 6, assume the input to the decode circuit is S=0, T=0, X=0, Y=0 and Z=1. It will be apparent that the logic "circuit 6-2" (not shown in FIG. 6) of the decode circuit will be selected to provide the output function $\bar{S}\cdot\bar{T}\cdot\bar{X}\cdot\bar{Y}\cdot Z$ at output $\bar{B}$ thereof. Namely, the output of the selected logicl "circuit 6-2" is a binary "0", i.e., DOWN level, whereas the remaining thirty-one (unselected) outputs of the decode circuit are each a binary "1", i.e., an UP level.

Again referring to FIG. 6 and Table No. 6, assume the input to the decode circuit is S=0, T=1, X=1, Y=1 and Z=1. It will be apparent that the logic "circuit 6-16" of the decoder will be selected to provide the output function $\bar{S}\cdot T\cdot X\cdot Y\cdot Z$ at output $\bar{B}$ thereof. Namely, the output of the selected logic "circuit 6-16" is a binary "0", i.e., DOWN level, whereas the remaining thirty-one (unselected) outputs of the decode circuit are each a binary "1", i.e., an UP level.

From the foregoing detailed explanation and description of the preferred embodiments of the invention, the following advantages and features will be fully apparent to persons skilled in the art.

Simplified Design Improves Performance

It is generally true that the simpler the design of an integrated circuit, the better the performance. The simple physical and electrical design of this circuit results in improved performance relative to many other decode designs.

May Be Designed For UP Level Or DOWN Level Select

This circuit may be designed to generate either an UP level or a DOWN level at its output when the desired address is present at its input. The very extensive scope of this decoder is a result of the capability of the circuit to be designed to produce OR, NOR, AND and NAND functions.

Complete Decoding Is Accomplished In Only One Logic Level

This decoder established its own switching threshold and performs complete decoding in only one level of logic for minimal circuit delay.

Eliminates The Need For A True/Complement Generator

Complementary NPN, PNP decoding and the ability of this circuit to provide OR, NOR, AND and NAND functions eliminates the need for it to be supplied with both true and complement inputs.

Physical Design Makes Layout Simple and Efficient

Only two metallurgy lines provide the interconnections to all of the NPN and PNP emitters and collectors. Emitter and collector contacts of NPN and PNP transistors are transposed so that they may be interconnected as required by straight metallurgy lines thus avoiding zig zags and cross-overs in the metallurgy.

Complementary Decoding Requires Only Half The Number of Metal Lines Over the Decoder Since both true and complement inputs are not required for this decoder, only half of the usual number of metallurgy lines are needed in the decode input wire matrix.

Base Inputs Proivde High Impedance For Minimal Loading of Driver Circuits

The base circuits of the decoder appear as high impedances to the circuits driving them. The inputs require only microamperes of drive current in both the UP and DOWN levels.

Current Source Emitter Circuits Avoid Current Hogging At Inputs

Current source design used in the emitter circuits of both the NPN and PNP transistors avoids base emitter clamping or current hogging of the input address lines when the lines are loaded by more than one decoder.

Decoder May Be Driven Directly From Off Chip Drivers

Decoders are usually driven by true/complement generators located on the same chip. This decoder, however, may be driven directly from off-chip nets, taking advantage of their low impedance and ability to drive the metallurgy capacitance of the decode input wire matrix.

Current Mode Design Eliminates Need For Anti-Saturation Clamps

By choosing the correct ratio of emitter to collector resistor values, a current mode circuit may be designed to avoid saturation, without the use of anti-saturation clamp diodes. The operating current of the circuit is determined by the value of the emitter resistor while the voltage transition at the collector is determined by the value of the collector load resistor. Thus, the collector load may be designed to keep the circuit out of saturation.

Balanced Design Makes Circuit Insensitive To Temperature

The balanced current mode design cancels the effect of Vbe temperature coefficients and guarantees a stable input threshold at all operating temperatures.

Reference Voltage May Be Adjusted For Desired Input Threshold

The current mode configuration of this circuit makes use of a threshold determining reference voltage which may be chosen to provide an input threshold compatible with a variety of driving circuitry.

Operates Over A Wide Power Supply Voltage Range

Current mode operation removes power supply voltage constraints.

May Be Designed To Operate Over A Wide Current Range

Circuit current may be designed to provide the desired performance without degradation of stability, reliability or noise margin.

From the preceding detailed description of the invention, it will be apparent to persons skilled in the art that numerous modifications and changes may be made to the decode circuit and logic circuits of the invention without departing from the spirit and scope of the invention. For example, the individual logic circuits of the decode circuit have a utility when employed independent of a decode circuit. The number of inputs of the decode circuit and of the logic circuit are respectively theoretically without limit. The decode circuit, in accordance with the invention, may have, as desired, either an UP level (selected) output or a DOWN level (selected) output. The logic circuit, in accordance with the invention, may have, as desired, either an UP level (selected) output or a DOWN level (selected) output.

Figure 7A:
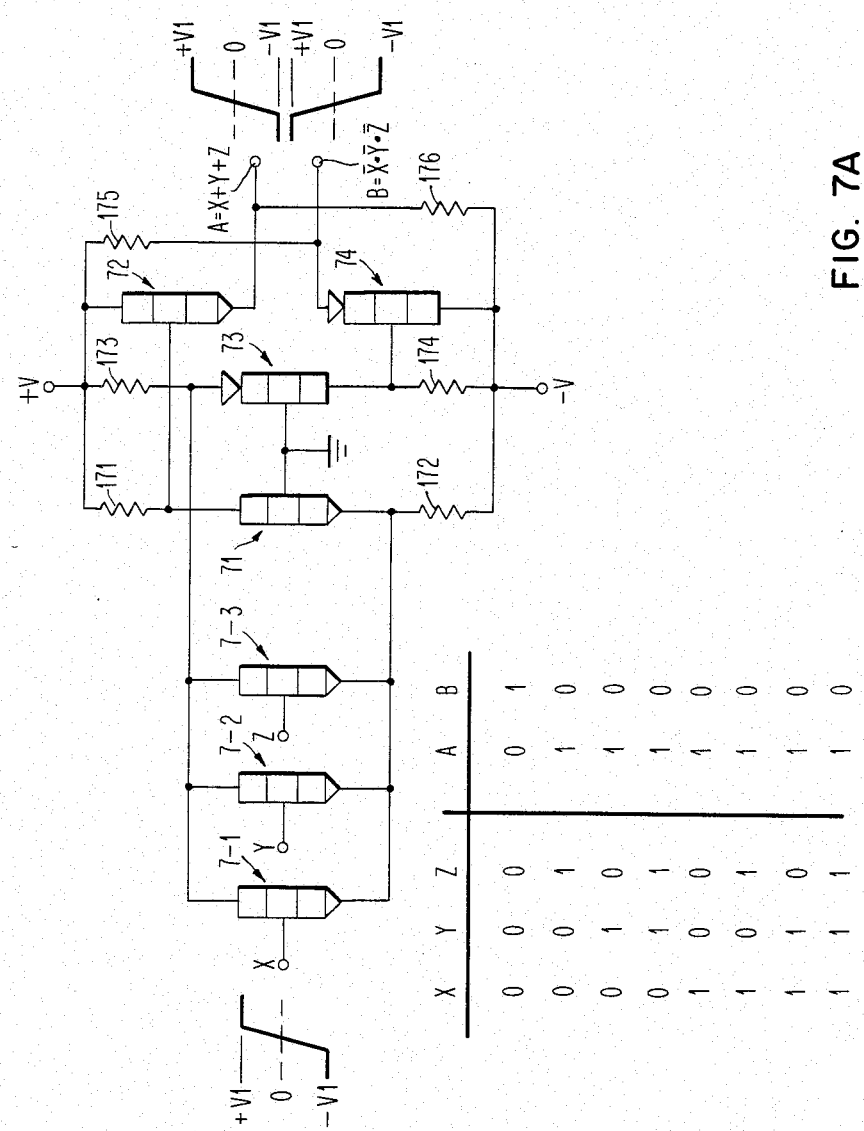
FIG. 7A discloses a logical binary circuit for accepting three binary inputs X, Y, Z and providing a true binary output $A = X + Y + Z$ and a complement binary output $B = \overline{X} \cdot \overline{Y} \cdot \overline{Z}$.
Figure 7B:
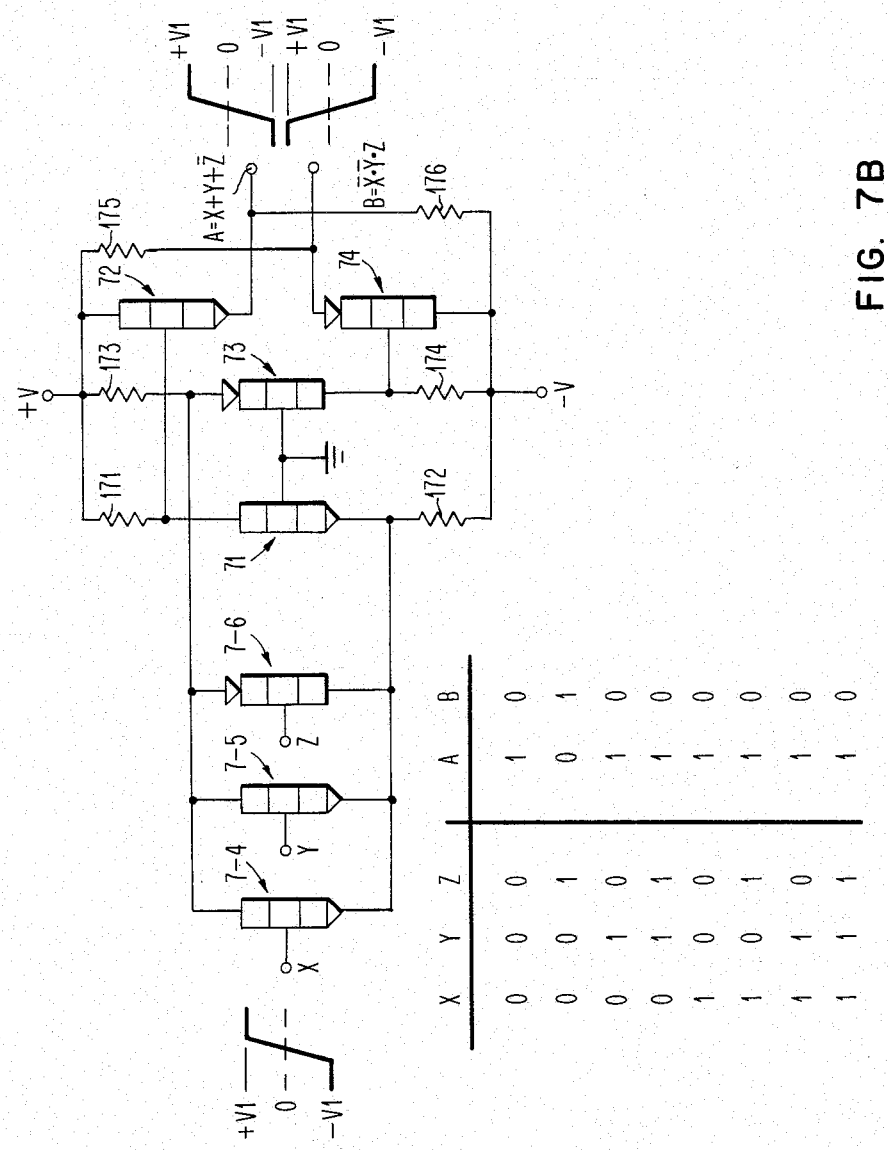
FIG. 7B discloses a logical binary circuit for accepting three binary inputs X, Y, Z and providing a true binary output $A=X+Y+\overline{Z}$ and a complement binary output $B=\overline{X}\cdot\overline{Y}\cdot Z$.
Figure 7C:
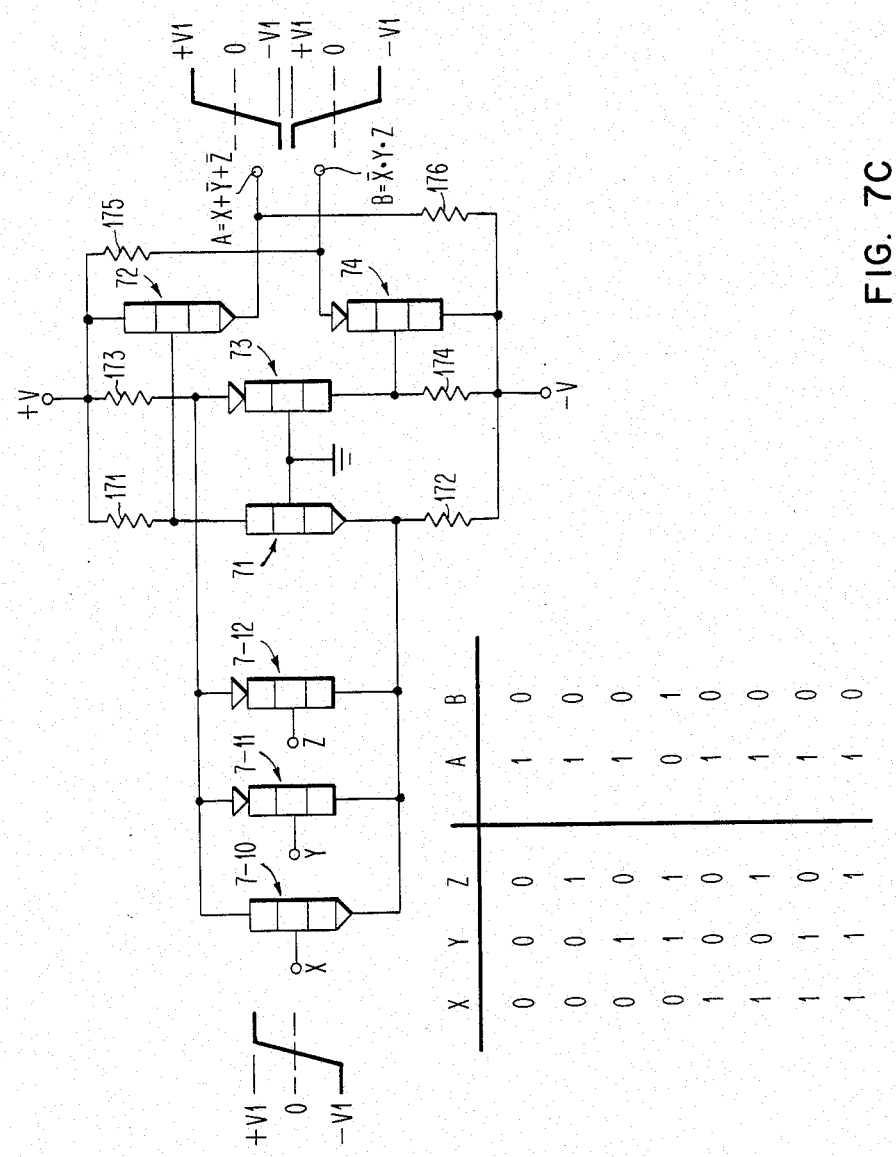
FIG. 7C discloses a logical binary circuit for accepting three binary inputs X, Y, Z and providing a true binary output $A=\overline{X}+\overline{Y}+\overline{Z}$ and a complement binary output $B=\overline{X}\cdot Y \cdot Z$.
Figure 7D:
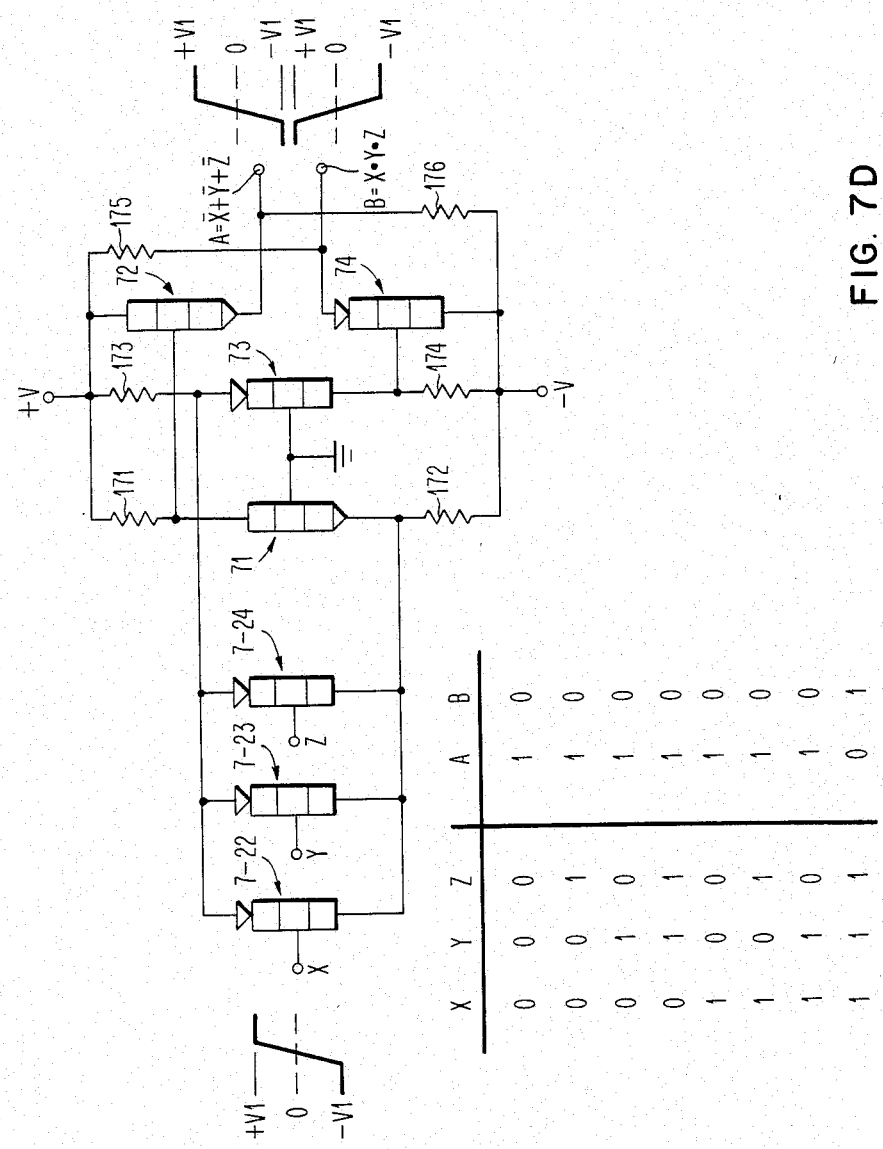
FIG. 7D discloses a logical binary circuit for accepting three binary inputs X, Y, Z and providing a true binary output $A=\overline{X}+\overline{Y}+\overline{Z}$ and a complement binary output $B=X\cdot Y\cdot Z$.

Reference is made to the logic circuits of Figures 7A, 7B, 7C and 7D. In FIG. 7C, the logic circuit has first, second and third inputs (X, Y, Z) and two emitter follower outputs (A, B). First, second and third NPN transistors (7-10, 7-11, 7-12) together with a collector load resistor (171) and an emitter current source (172, −V) provide an NPN current switch emitter follower. First, second, third and fourth PNP transistors (7-11, 7-12, 73, 74) together with a collector load resistor (174) and an emitter current source (173 +V) provide a PNP current switch emitter follower. The collector of the input NPN transistor (7-10) is connected to the emitters of the PNP logic transistors (7-11, 7-12, 73). The collectors of the input PNP transistors are connected to the emitters of the NPN logic transistors (7-10, 71). The collector of the non-inverting NPN transistor (71) is connected to the base of an NPN emitter follower (72) and the collector of the non-inverting PNP transistor (73) is connected to the base of a PNP emitter follower (74). Thus, a dual current switch emitter follower capable of being turned on or off by either the NPN or PNP input transistors is formed. The emitter followers provide low impedance drive, and output logic levels that are compatible with the input threshold.

Collector dotting is not necessary because complementary inputs and dual phase outputs produce OR, NOR, AND and NAND functions in one logic circuit. The desired functions can be extended by adding more, either or both NPN and PNP, input transistors.

It will also be appreciated that a decode circuit may be fabricated by employing a plurality of logic circuits of the type expressly shown in FIGS. 7A through 7D.

Still referring to FIG. 7C, when the inputs to the logic circuit are X=1, Y=1 and Z=1, transistor 7-10 is on and transistors 7-11, 7-12, 71 and 73 are off. With transistor 7-10 on, current flows from terminal +V, through resistor 173, transistor 7-10 and resistor 172 into terminal −V. The resulting voltage drop across resistor 173 turns transistor 73 off and the base of transistor 74 and also output terminal B go down. The resulting voltage drop across resistor 172 turns transistor 71 off and the base of transistor 72 and also output terminal A go up.

When the inputs to the circuit of FIG. 7B are X=1, Y=1 and Z=1, transistors 7-4 and 7-5 are on and transistors 7-6, 71 and 73 are off. With transistors 7-4 and 7-5 on, current flows from terminal +V, through resistor 173 through both transistors 7-4 and 7-5 (which ideally will each carry half of the current from resistor 173) through resistor 172 into terminal −V. The resulting voltage drop across resistor 173 turns transistor 73 off and the base of transistor 74 and also output terminal B go down. The resulting voltage drop across resistor 172 turns transistor 71 off and the base of transistor 72 and also output terminal A go up.

When the inputs to the circuit of FIG. 7C are X=0, Y=1 and Z=1, transistors 7-10, 7-11 and 7-12 are off and transistors 71 and 73 are on. With transistors 71 and 73 on, current flows from terminal +V through resistor 171, transistor 71 and resistor 172 into −V. The resulting voltage drop across resistor 171 produces a down level at the base of transistor 72 and also at output terminal A. Current also flows from terminal +V, through resistor 173, transistor 73 and resistor 174 into −V. The resulting voltage drop across resistor 174 produces an up level at the base of transistor 74 and also at output terminal B.

While this invention has been particularly described with reference to the preferred embodiments thereof, it will be understood by those skilled in the art that the foregoing and other changes in form and details may be made therein without departing from the spirit and scope of the invention.

I claim:

1. In a decode circuit having first and second inputs for respectively accepting a first binary input X, a second binary input Y and in response thereto selecting a single one of four outputs, each of said four outputs of said decode circuit being respectively a logical binary function of said first binary input X and said second binary input Y, said decode circuit including at least one logical circuit, said logical circuit accepting said first binary input X, said second binary input Y and providing a binary output which is one of said four outputs of said decode circuit, said binary output of said at least one logical circuit being the logical function $\overline{B}=\overline{X\cdot Y}$, said logical circuit comprising:

first, second and third transistors of a first conductivity type, each of said first, second and third transistors having an emitter, base and collector, said emitters of said first, second and third transistors being connected in common, said bases of first and second transistors being respectively connected to said first and second inputs of said decode circuit;

a fourth transistor of a second conductivity type, said fourth transistor having an emitter, base and collector, said collector of said first transistor, said collector of said second transistor and said emitter of said fourth transistor being connected in common, said base of said third transistor and said base of said fourth transistor being connected in common to a second source of potential;

a first resistor connected between said emitter of said fourth transistor and a first source of potential;

a second resistor connected between said collector of said third transistor and said first source of potential;

a third resistor connected between said emitter of said third transistor and a third source of potential;

passive connection means connecting the collector of said fourth transistor to said third source of potential; and an output terminal for providing the binary output $\overline{B}=\overline{X\cdot Y}$, said output terminal being connected to the collector of said third transistor.

2. In a decode circuit, as recited in claim 1, wherein said first potential source provides a potential V1, said second potential source provides a potential V2, said third potential source provides a potential V3 and the absolute magnitudes of said first, second and third potentials bear the following relationship one to another, $|V1|<|V2|<|V3|$.

3. In a decode circuit having first, second and third inputs for respectively accepting a first binary input X, a second binary input Y and a third binary input Z and in response thereto selecting a single one of eight outputs, each of said eight outputs of said decode circuit being respectively a logical function of said first binary input X, said second binary input Y and said third binary input Z, said decode circuit including at least one logical circuit, said logical circuit accepting said first binary input X, said second binary input Y and said third binary input Z and providing a binary output which is one of said eight outputs of said decode circuit, said binary output of said at least one logical circuit being the logical function $\overline{B}=\overline{X\cdot Y\cdot Z}$, said logical circuit comprising:

first, second, third and fourth transistors of a first conductivity type, each of said first, second, third and fourth transistors having an emitter, base and collector, said emitters of said first, second, third and fourth transistors being connected in common, said bases of said first, second and third transistors being respectively connected to said first, second and third inputs of said decode circuit;

a fifth transistor of a second conductivity type, said fifth transistor having an emitter, base and collector, said collector of said first transistor, said collector of said second transistor, said collector of said third transistor and said emitter of said fifth transistor being connected in common, said base of said fourth transistor and said base of said fifth transistor being connected in common to a second source of potential;

a first resistor connected between said emitter of said fifth transistor and a first source of potential;

a second resistor connected between said collector of said fifth transistor and a third source of potential;

a third resistor connected between said emitter of said fourth transistor and said third source of potential;

passive connection means connecting the collector of said fourth transistor to said first source of potential; and an output terminal for providing the binary output $\overline{B}=\overline{X\cdot Y\cdot Z}$, said output terminal being connected to the collector of said fifth transistor.

4. In a decode circuit, as recited in claim 3, wherein said first potential source provides a potential V1, said second potential source provides a potential V2, said third potential source provides a potential V3 and the absolute magnitudes of said first, second and third potentials bear the following relationship one to the other, $|V1|<|V2|<|V3|$.

5. In a decode circuit having first, second, third, fourth and fifth inputs for respectively accepting a first binary input S, a second binary input T, a third binary input X, a fourth binary input Y and a fifth binary input Z and in response thereto selecting a single one of thirty-two outputs, each of said thirty-two outputs of said decode circuit being respectively a logical function of said first binary input S, said second binary input T, said third binary input X, said fourth binary input Y and said fifth binary input Z, said decode circuit including at least one logical circuit, said logical circuit accepting said first binary input S, said second binary input T, said third binary input X, said fourth binary input Y and said fifth binary input Z and providing a binary output which is one of said thirty-two outputs of said decode circuit, said binary output of said at least one logical circuit being the logical function $\overline{B}=\overline{S\cdot T\cdot X\cdot Y\cdot Z}$, said logical circuit comprising:

first, second, third, fourth, fifth and sixth transistors of a first conductivity type, each of said first, second, third, fourth, fifth and sixth transistors having an emitter, base and collector, said emitters of said first, second, third, fourth, fifth and sixth transistors being connected in common, said bases of said first, second, third, fourth and fifth transistors being respectively connected to said first, second, third, fourth and fifth inputs of said decode circuit;

a seventh transistor of a second conductivity type, said seventh transistor having an emitter, base and collector, said collector of said first transistor, said collector of said second transistor, said collector of said third transistor, said collector of said fourth transistor, said collector of said fifth transistor and said emitter of said seventh transistor being connected in common, said base of said sixth transistor and said base of said seventh transistor being connected in common to a second source of potential;

a first resistor connected between said emitter of said seventh transistor and a first source of potential;

a second resistor connected between said collector of said seventh transistor and a third source of potential;

a third resistor connected between said emitter of said sixth transistor and said third source of potential;

passive connection means connecting the collector of said sixth transistor to said first source of potential; and an output terminal for providing the binary output $\overline{B} = \overline{S} \cdot \overline{T} \cdot \overline{X} \cdot \overline{Y} \cdot \overline{Z}$, said output terminal being connected to the collector of said seventh transistor.

6. In a decode circuit, as recited in claim 5, wherein said first potential source provides a potential V1, said second potential source provides a potential source V2, said third potental source provides a potential V3 and the absolute magnitudes of said first, second and third potentials bear the following relationship one to the other, $|V1| < |V2| < |V3|$.

7. In a decode circuit having first and second inputs for respectively accepting a first binary input X, a second binary input Y and in response thereto selecting a single one of four outputs, each of said four outputs of said decode circuit being respectively a logical binary function of said first binary input X and said second binary input Y, said decode circuit including at least one logical circuit, said logical circuit accepting said first binary input X, said second binary input Y and providing a binary output which is one of said four outputs of said decode circuit, said binary output of said at least one logical circuit being the logical function $B = \overline{X} \cdot \overline{Y}$, said logical circuit comprising:

first, second and third transistors of a first conductivity type, each of said first, second and third transistors having an emitter, base and collector, said emitters of said first, second and third transistors being connected in common, said bases of first and second transistors being respectively connected to said first and second inputs of said decode circuit;

a fourth transistor of a second conductivity type, said fourth transistor having an emitter, base and collector, said collector of said first transistor, said collector of said second transistor and said emitter of said fourth transistor being connected in common, said base of said third transistor and said base of said fourth transistor being connected in common to a second source of potential;

a first resistor connected between said emitter of said fourth transistor and a first source of potential;

a second resistor connected between said collector of said fourth transistor and a third source of potential;

a third resistor connected between said emitter of said third transistor and said third source of potential;

passive connection means connecting the collector of said third transistor to said first source of potential; and an output terminal for providing the binary output $B = \overline{X} \cdot \overline{Y}$, said output terminal being connected to the collector of said fourth transistor.

8. In a decode circuit, as recited in claim 7 wherein said first potential source provides a potential V1, said second potential source provides a potential V2, said third potential source provides a potential V3 and the absolute magnitudes of said first, second and third potentials bear the following relationship one to another, $|V1| < |V2| < |V3|$.

9. In a decode circuit having first, second and third inputs for respectively accepting a first binary input X, a second binary input Y and a third binary input Z and in response thereto selecting a single one of eight outputs, each of said eight outputs of said decode circuit being respectively a logical function of said first binary input X, said second binary input Y and said third binary input Z, said decode circuit including at least one logical circuit, said logical circuit accepting said first binary input X, said second binary input Y and said third binary input Z and providing a binary output which is one of said eight outputs of said decode circuit, said binary output of said at least one logical circuit being the logical function $B = \overline{X} \cdot \overline{Y} \cdot \overline{Z}$, said logical circuit comprising:

first, second, third and fourth transistors of a first conductivity type, each of said first, second, third and fourth transistors having an emitter, base and collector, said emitters of said first, second, third and fourth transistors being connected in common, said bases of said first, second and third transistors being respectively connected to said first, second and third inputs of said decode circuit;

a fifth transistor of a second conductivity type, said fifth transistor having an emitter, base and collector, said collector of said first transistor, said collector of said second transistor, said collector of said third transistor and said emitter of said fifth transistor being connected in common, said base of said fourth transistor and said base of said fifth transistor being in common to a second source of potential;

a first resistor connected between said emitter of said fifth transistor and a first source of potential;

a second resistor connected between said collector of said fourth transistor and said first source of potential;

a third resistor connected between said emitter of said fourth transistor and a third source of potential;

passive connection means connecting the collector of said fifth transistor to said third source of potential; and an output terminal for providing the binary output $\overline{B} = \overline{X} \cdot \overline{Y} \cdot \overline{Z}$, said output terminal being connected to the collector of said fourth transistor.

10. In a decode circuit, as recited in claim 9, wherein said first potential source provides a potential V1, said second potential source provides a potential V2, said third potential source provides a potential V3 and the absolute magnitudes of said first, second and third potentials bear the following relationship one to the other, $|V1| < |V2| < |V3|$.

11. In a decode circuit having first, second, third, fourth and fifth inputs for respectively accepting a first binary input S, a second binary input T, a third binary input X, a fourth binary input Y and a fifth binary input Z and in response thereto selecting a single one of thirty-two outputs, each of said thirty-two outputs of said decode circuit being respectively a logical function of said first binary input S, said second binary input T, said third binary input X, said fourth binary input Y and said fifth binary input Z, said decode circuit including at least one logical circuit, said logical circuit accepting said first binary input S, said second binary input T, said third binary input X, said fourth binary input Y and said fifth binary input Z and providing a binary output which is one of said thirty-two outputs of said decode circuit, said binary output of said at least one logical circuit being the logical function $\overline{B} = \overline{S \cdot T \cdot X \cdot Y \cdot Z}$, said logical circuit comprising:

first, second, third, fourth, fifth and sixth transistors of a first conductivity type, each of said first, second, third, fourth, fifth and sixth transistors having an emitter, base and collector, said emitters of said first, second, third, fourth, fifth and sixth transistors being connected in common, said bases of said first, second, third, fourth and fifth transistors being respectively connected to said first, second, third, fourth and fifth inputs of said decode circuit;

a seventh transistor of a second conductivity type, said seventh transistor having an emitter, base and collector, said collector of said first transistor, said collector of said second transistor, said collector of said third transistor, said collector of said fourth transistor, said collector of said fifth transistor and said emitter of said seventh transistor being connected in common, said base of said sixth transistor and said base of said seventh transistor being connected in common to a second source of potential;

a first resistor connected between said emitter of said seventh transistor and a first source of potential;

a second resistor connected between said collector of said sixth transistor and said first source of potential;

a third resistor connected between said emitter of said sixth transistor and said third source of potential;

passive connection means connecting the collector of said seventh transistor to said third source of potential; and an output terminal for providing the binary output $B = \overline{S \cdot T \cdot X \cdot Y \cdot Z}$, said output terminal being connected to the collector of said sixth transistor.

12. In a decode circuit, as recited in claim 11, wherein said first potential source provides a potential V1, said second potential source provides a potential source V2, said third potential source provides a potential V3 and the absolute magnitudes of said first, second and third potentials bear the following relationship one to the other, $|V1| < |V2| < |V3|$.

13. A decode circuit having n inputs for accepting n binary inputs where n is a positive integer, said decode circuit having $2^n$ output terminals, said decode circuit comprising:

$2^n$ logic circuits, each of said $2^n$ logic circuits being similar one to another and having a like number of components, each of said $2^n$ logic ciructs including $n+2$ transistors, at least one transistor of said $n+2$ transistors of each of said $2^n$ logic circuits being a PNP transistor;

each of said $2^n$ logic circuits having n inputs respectively connected to said n inputs of said decode circuit;

each of said $2^n$ logic circuits having an output connected to a predetermined one of said $2^n$ output terminals of said decode circuit;

and said decode circuit being further characterized in that a decode function is accomplished in a single logic level, each of said $2^n$ logic circuits having an input circuit portion and output circuit portion;

each said input circuit portion of said $2^n$ logic circuits comprising n transistors, each of said n transistors of each of said $2^n$ input circuit portions having an emitter, base and collector;

each of said input circuit portions having k transistors of a first conductivity type and a n-k transistors of a second conductivity type, where k has a distinct positive integer value for each of said $2^n$ logic circuits and k is an integer having a range of 0 through n, each base of said n transistors of each input circuit portion being connected to a predetermined one of said n inputs of said logic circuit;

each of said input circuit portions of said $2^n$ logic circuits having first passive circuit means connecting in common said collectors of said k transistors of said first conductivity type and said emitters of said n-k transistors of said second conductivity type and second passive circuit means connecting in common said emitters of said k transistors of said first conductivity type and said collectors of said n-k transistors of said second conductivity type, each of said output circuit portions of said $2^n$ logic circuits comprising, a first transistor of a first conductivity type having an emitter, base and collector and a second transistor of a second conductivity type having an emitter, base and collector, said emitter of said transistor of said second conductivity type being connected to said first passive circuit means of said input circuit portion, said emitter of said transistor of said first conductivity type being connected to said second passive circuit means of said input circuit portion, a first resistor connected between the emitter of said second transistor and a first source of potential, a second resistor connected between said collector of said first transistor and said first source of reference potential, a third resistor connected between said emitter of said first transistor and a third source of potential, said collector of said second transistor being connected to said third source of potential, said base of said first transistor and said base of said second transistor being connected to a second source of potential and said output terminal of said logic circuit being connected to said collector of said first transistor.

14. A logic circuit having n inputs for accepting n binary inputs where n is a positive integer and having an output terminal for providing as an output a predetermined logical binary function of said n inputs, said logic circuit comprising:

n transistors of a first conductivity type, each of said n transistors having an emitter, base and collector;

an $n+1$ transistor of said first conductivity type, said $n+1$ transistor having an emitter, base and collector;

an $n+2$ transistor of a second conductivity type, said $n+2$ transistor having an emitter, base and collector;

first passive connection means connecting in common said collectors of said n transistors and said emitter of said $n+2$ transistor;

second passive connection means connecting in common said emitters of said n transistors and said emitter of said $n+1$ transistor;

third passive connection means for respectively connecting each of said n inputs of said logic circuit to the base of a discrete one of said n transistors;

a first resistor connected between said emitter of said $n+2$ transistor and a first source of potential;

a second resistor connected between said collector of said n+1 transistor and said first source of potential;

a third resistor connected between said emitter of said n+1 transistor and a third source of potential;

fourth passive connection means connecting said collector of said n+2 transistor to said third source of potential;

fifth passive connection means connecting said base of said n+1 transistor and said base of said n+2 transistor in common to a second source of potential; and said output terminal of said logic circuit being connected to said collector of said n+1 transistor.

15. A logic circuit, as recited in claim 14 wherein k transistors of said n transistors are of said second conductivity type, whereby n-k of said transistors are of said first conductivity type, where k is a positive integer having a value range of 0, 1, 2, . . . through n, and wherein said emitters of said k transistors are connected to said first passive connection means, and said collectors of said k transistors are connected to said second passive connection means.

16. A logic circuit having n inputs for accepting n binary inputs where n is a positive integer and having a first output terminal for providing as an output a predetermined logical binary function of said in binary inputs, and a second output terminal for providing as an output the complement of said predetermined logical binary function of said n binary inputs, said logic circuit comprising:

n transistors of a first conductivity type, each of said n transistors having an emitter, base and and collector;

an n+1 transistor of said first conductivity type, said n+1 transistor having an emitter, base and collector;

an n+2 transistor of said first conductivity type, said n+2 transistor having an emitter, base and collector, said base of said n+2 transistor being connected to said collector of said n+1 transistor;

an n+3 transistor of a second conductivity type, said n+3 transistor having an emitter, base and collector;

an n+4 transistor of said second conductivity type, said n+4 transistor having an emitter, base and collector, said base of said n+4 transistor being connected to said collector of said n+3 transistor;

first passive connection means connecting in common said collectors of said n transistors and said emitter of said n+3 transistor;

second passive connection means connecting in common said emitters of said n transistors and said emitter of said n+1 transistor;

third passive connection means for respectively connecting each of said n inputs of said logic circuit to the base of a discrete one of said n transistors;

fourth passive connection means for connecting said first output terminal of said logic circuit to said emitter of said n+2 transistor;

fifth passive connection means for connecting said second output terminal of said logic circuit to said emitter of said n+4 transistor;

a first resistor connected between said collector of said n+1 transistor and a first source of potential;

a second resistor connected between said emitter of said n+1 transistor and a second source of potential;

a third resistor connected between said emitter of said n+3 transistor and said first source of potential;

a fourth resistor connected between said collector of said n+3 transistor and said second source of potential;

a fifth resistor connected between said emitter of said n+4 transistor and said first source of potential;

a sixth resistor connected between said emitter of said n+2 transistor and said second source of potential;

sixth passive connection means for connecting said base of said n+1 transistor and said base of said n+3 transistor to a source of reference potential; and additional passive connection means for connecting said collector of said n+2 transistor to said first source of potential and also connecting said collector of said n+4 transistor to said second source of potential.

17. A logic circuit, as recited in claim 16, wherein k transistors of said n transistors are of said second conductivity type, whereby n-k of said transistors are of said first conductivity type, where k is a positive integer having a value range of 0, 1, 2, . . . through n, and wherein said emitters of said k transistors are connected to said first passive connection means, and said collectors of said k transistors are connected to said second passive connection means.

18. A logic circuit, as recited in claim 17, wherein k=n and wherein said emitter of said k transistors are connected to said first passive connection means, and said collectors of said k transistors are connected to said second passive connection means.

19. A logic circuit having n inputs for accepting n binary inputs, where n is a positive integer, said logic circuit having a first output terminal for providing as an output a predetermined logical binary function of said n binary inputs and a second output terminal for providing as an output the complement of said predetermined logical binary function of said n binary inputs, said logic circuit comprising:

n input transistors, each of said n input transistors having an emitter, base and collector, where n is integer number having minimal value of 2, and a range of 2, 3, 4, 5, 6 . . . through 16, p of said n transistors being of a first conductivity type, k of said n transistors being of a second conductivity type, where p and k are respectively integers having a value within the range 0, 1, 2, 3, 4 . . . through n, and $p+k=n$;

an n+1 transistor of said first conductivity type, said n+1 transistor having an emitter, base and collector;

an n+2 transistor of said first conductivity type, said n+2 transistor having an emitter, base and collector, said base of said n+2 transistor being connected to said collector of said n+1 transistor;

an n+3 transistor of said second conductivity type, said n+3 transistor having an emitter, base and collector;

an n+4 transistor of said second conductivity type, said n+4 transistor having an emitter, base and collector, said base of said n+4 transistor being connected to said collector of said N+3 transistor;

first passive connection means connecting in common said collectors of said p transistors of said first conductivity type, said emitters of said k transistors of said second conductivity type and said emitter of said n+3 transistor;

second passive connection means connecting in common said emitters of said p transistors of said first conductivity type, said collectors of said k transistors of said second conductivity type and said emitter of said $n+1$ transistor;

third passive connection means for respectively connecting each of said n inputs of said logic circuit to the base of a discrete one of said n input transistors;

fourth passive connection means for connecting said first output terminal of said logic circuit to said emitter of said $n+2$ transistor;

fifth passive connection means for connecting said second output terminal of said logic circuit to said emitter of said $n+4$ transistor;

sixth passive connection means for connecting said base of said $n+1$ transistor and said base of said $n+3$ transistor to a source of reference potential;

a first resistor connected between said collector of said $n+1$ transistor and a first source of potential;

a second resistor connected between said emitter of said $n+1$ transistor and a second source of potential;

a third resistor connected between said emitter of said $n+3$ transistor and said first source of potential;

a fourth resistor connected between said collector of said $n+3$ transistor and said second source of potential;

a fifth resistor connected between said emitter of said $n+4$ transistor and said first source of potential;

a sixth resistor connected between said emitter of said $n+2$ transistor and said second source of potential; and additional passive connection means for connecting said collector of said $n+2$ transistor to said first source of potential and also connecting said collector of said $n+4$ transistor to said second source of potential.

* * * * *

UNITED STATES PATENT AND TRADEMARK OFFICE
CERTIFICATE OF CORRECTION

PATENT NO. : 4,494,017
DATED : January 15, 1985
INVENTOR(S) : Frank A. Montegari It is certified that error appears in the above-identified patent and that said Letters Patent is hereby corrected as shown below:

Column 1, line 58, Change "Ossipation" to --Dissipation--.

Column 7, line 3, Change "current 2-2" to --circuit 2-2--.

Column 10, line 26, Change "$\bar{X} \cdot Y \cdot \bar{Z}$" to --$\bar{X} \cdot Y \cdot \bar{Z}$--.

Column 10, line 52, Change "$\bar{X} \cdot \bar{Y} \cdot OVS/Z/$" to --$\bar{X} \cdot \bar{Y} \cdot \bar{Z}$--.

Column 11, line 65, Change "$\bar{S} \cdot \bar{T} \cdot \bar{X} \cdot \bar{Y} \cdot \bar{Z}$" to --$\bar{S} \cdot \bar{T} \cdot \bar{X} \cdot \bar{Y} \cdot \bar{Z}$--.

Signed and Sealed this

Nineteenth Day of November 1985

[SEAL]

Attest:

DONALD J. QUIGG

Attesting Officer     Commissioner of Patents and Trademarks